(12) United States Patent
Okahisa et al.

(10) Patent No.: US 7,691,732 B2
(45) Date of Patent: Apr. 6, 2010

(54) MANUFACTURING METHOD OF NITRIDE SUBSTRATE, NITRIDE SUBSTRATE, AND NITRIDE-BASED SEMICONDUCTOR DEVICE

(75) Inventors: Takuji Okahisa, Itami (JP); Hideaki Nakahata, Itami (JP); Koji Uematsu, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 70 days.

(21) Appl. No.: 12/141,266

(22) Filed: Jun. 18, 2008

(65) Prior Publication Data

US 2009/0315149 A1    Dec. 24, 2009

(51) Int. Cl.
*H01L 21/20* (2006.01)
(52) U.S. Cl. .................. 438/481; 438/44; 438/46; 438/478; 257/E21.108; 257/E21.461
(58) Field of Classification Search ................ 438/23, 438/41, 42, 44, 93, 484, 518, 572, 590; 257/E21.097, 257/E21.461, E21.603
See application file for complete search history.

(56) References Cited

U.S. PATENT DOCUMENTS

| 6,468,347 | B1 * | 10/2002 | Motoki et al. .............. 117/89 |
| 6,972,206 | B2 * | 12/2005 | Goto et al. ................. 438/22 |
| 2008/0057608 | A1 * | 3/2008 | Ishibashi et al. ............ 438/42 |

FOREIGN PATENT DOCUMENTS

| JP | 2001-102307 | 4/2001 |
| JP | 2003-165799 | 6/2003 |
| JP | 2003-183100 | 7/2003 |

* cited by examiner

*Primary Examiner*—Savitri Mulpuri
*Assistant Examiner*—Cheung Lee
(74) *Attorney, Agent, or Firm*—Drinker Biddle & Reath LLP

(57) ABSTRACT

A manufacturing method of a nitride substrate includes the steps of preparing a ground substrate; forming a mask on the ground substrate; placing the ground substrate in a reactor, and heating the ground substrate to a temperature of 850° C. to 1100° C. In the step of heating the ground substrate, HCl and $NH_3$ are supplied into the reactor so that partial pressure $P_{HCl}$ satisfies $(1.5+0.0005\ p)\ kPa \leq P_{HCl} \leq (4+0.0005\ p)\ kPa$ and partial pressure $P_{NH3}$ satisfies $(15-0.0009\ p)\ kPa \leq P_{NH3} \leq (26-0.0017\ p)\ kPa$, whereby an $Al_xGa_yIn_{1-x-y}N$ crystal ($0 \leq x < 1$, $0 < y \leq 1$) is grown, and whereby a ridge-valley structure including a plurality of ridges and valleys parallel to one another is formed. The $Al_xGa_yIn_{1-x-y}N$ crystal is grown so that the ridge-valley structure is not buried while a height of the valleys from the ground substrate is allowed to exceed 2.5 (p–s).

8 Claims, 13 Drawing Sheets

MANUFACTURING METHOD OF NITRIDE SUBSTRATE, NITRIDE SUBSTRATE, AND NITRIDE-BASED SEMICONDUCTOR DEVICE

BACKGROUND OF THE INVENTION

1. Field of the Invention

The present invention relates to a manufacturing method of a substrate of a compound formed by a group III element and nitrogen (hereinafter referred to as a nitride), which is expressed by $Al_xGa_yIn_{1-x-y}N$ ($0 \leq x<1$, $0<y \leq 1$).

2. Description of the Background Art

While a crystal such as GaN, AlGaN, InGaN, or InN is often epitaxially grown as a thin film over a substrate such as sapphire or SiC, it is difficult to manufacture a thick free-standing substrate. Even when a free-standing substrate is obtained, often, dislocation density is high and the quality is low. At present, there are no large nitride free-standing crystal substrates having low dislocation density and high quality.

As a substrate for a blue light emitting element, a sapphire substrate is widely employed. A blue or green light emitting element (light emitting diode (LED) or laser diode (LD)) is manufactured by forming n-type and p-type thin films of GaN or InGaN on a sapphire substrate ($\alpha-Al_2O_3$). The sapphire substrate is readily available, and physically and chemically stable and a GaN or InGaN thin film can be grown thereon.

The sapphire substrate is disadvantageous in that it is an insulator and has no cleavage. Sapphire is not threefold rotational symmetric and therefore does not have a clear cleavage plane. It cannot be separated into chips by natural clearage after multiple light emitting element units are formed thereon. Mechanical cutting by dicing is required. This reduces the yield.

Since it is an insulator, an n electrode cannot be formed on the rear surface. Both n and p electrodes have to be formed on the upper surface, whereby the required chip area is increased, the etching steps are increased and the wires bonded are doubled. Since a current flows laterally in the n layer, the n layer must be thick.

Since the lattice mismatch is great between sapphire and gallium nitride (GaN), GaN or InGaN epitaxially grown on the sapphire substrate contains dislocations of high density. Therefore, it is a thin film of low quality. A commercially available GaN thin film formed on a sapphire substrate contains dislocations in a density of not less than $1 \times 10^9 cm^{-2}$.

Because of such disadvantages, instead of the sapphire substrate, a GaN substrate, which is identical to the thin-film composition, is desirable. However, GaN does not melt even under high temperatures. The dissociation pressure of nitrogen under high temperatures is too high. The crystal growth cannot be attained by the Bridgeman method or the Czochralski method, which are methods of growing a crystal from melt.

Accordingly, instead of growth from liquid phase, vapor phase growth method is employed. Originally, vapor phase growth method is employed for manufacturing a thin film having a thickness of not more than about 1 μm, and not for a thick crystal such as a substrate. For manufacturing a GaN thin film, four vapor phase growth method, namely, the HVPE (Hydride Vapor Phase Epitaxy) method, the MOCVD (Metal Organic Chemical Vapor Deposition) method, the MOC (Metal Organic Chloride) method, and the sublimation method are possible.

The HVPE method is performed as follows. A Ga boat containing Ga melt is placed in an upper space of a hot-wall type reactor. A ground substrate (sapphire, SiC or the like) is placed on a susceptor in a lower space, and heated. From the above, $H_2$+HCl gas is blown in the Ga boat, to produce GaCl. $H_2$+$NH_3$ gas as supplied from the above and GaCl are reacted, to produce GaN, which is deposited on the ground substrate. $H_2$ is the carrier gas. The Ga material is metal Ga, and it is heated and used as a melt. The material of nitrogen is $NH_3$ gas. There is an advantage that carbon is not mixed into the generated GaN thin film, since the material gas does not contain carbon.

The MOCVD method is performed as follows. In a cold-wall type reactor, an organic metal material of Ga such as TMG (trimethyl gallium) and ammonia ($NH_3$) together with hydrogen gas are blown in a heated ground substrate, to produce GaN, which is deposited on the ground substrate. On the heated substrate, GaN is produced by the one-stage reaction of TMG+$NH_3$. This is the most frequently used method as a method for growing a GaN thin film. Thin-film growth for a blue-light emitting element is mostly performed by this method. However, there is a problem that the method requires a great amount of $NH_3$ gas and the yield is low. While the method is suitable for thin-film production, it is not very suitable for manufacture of a thick substrate crystal. Furthermore, since the material containing carbon is used, there is a problem that the carbon mixes into the GaN thin film.

The MOC method is performed as follows. In a hot-wall type reactor, TMG and HCl gas are reacted, to firstly produce GaCl. GaCl is caused to flow downstream and reacted with $NH_3$, to produce GaN, which is deposited on the heated ground substrate. It is similar to the MOCVD method above in that TMG is used as the Ga material. It is similar to the HVPE in that the two-stage reaction is employed, i.e., GaCl is firstly produced and then reacted with $NH_3$. Herein also the material includes carbon. However, since GaCl is firstly synthesized and then reacted with $NH_3$, mixture of carbon into GaN can be prevented. This is the advantage of the MOC method over the MOCVD method. This method also consumes a great amount of the material gas because TMG gas is used, and the yield is poor.

The sublimation method is performed as follows. Polycrystal GaN is used as the material. In a reactor, solid GaN material and a ground substrate are placed in separate locations, and heated in such a manner that the solid GaN material is heated to a higher temperature. Thus, the temperature gradient is created, whereby the sublimated GaN flows toward the ground substrate and deposits on the substrate having a lower temperature.

When a GaN thin film is grown on a ground substrate such as a sapphire, many dislocations occur. The dislocations extend upward, and hardly eliminated.

[1. ELO Method]

The first method used for reducing dislocations in a GaN thin film was the ELO (Epitaxial Lateral Overgrowth) method. On a sapphire ground substrate, an $SiO_2$ film is applied, and small windows each measuring about 0.5 μm to 2 μm are opened in a staggered manner. Thus, a mask is formed in which exposing portions (the windows) are far smaller than covering portion (the $SiO_2$ film). This is referred to as an ELO mask. Since growth of GaN is started from each isolated exposing portion, many isolated crystal grains each having a shape of truncated cone are produced. When the crystal rises over the edge of the covering portion, the growth proceeds laterally. The dislocations also extend laterally. The dislocation density becomes low over the exposing portion. Crystals laterally extending from adjacent windows collide and integrated on a bisector. Here, part of the dislocations cancel each other and are eliminated. At the integrated portion, dislocations survive and start growing upward.

This is a phenomenon that proceeds for a thickness as great as the interval of the windows (about 1 μm to 3 μm). This is effective for a thin film because of the thinness. However, thereafter, upward C-plane growth starts. The dislocations is not eliminated but also extend upward. When the crystal is grown thickly, the dislocations are dispersed and ultimately attaining a high dislocation density of not less than $10^9 cm^{-2}$. The ELO method, which merely cancels dislocations by lateral growth at the early stage of the growth, is not useful for reducing dislocations in a thick substrate crystal. However, in some cases, the present invention employs the ELO mask for part of the exposing structure in an additionally manner.

GaN is hexagonal system, wherein a-, b-, and c-axes are not equal. It has a threefold rotational symmetric structure around c-axis. When growing GaN on a foreign material substrate (sapphire, SiC), a ground substrate of which surface is the plane with threefold rotational symmetry is used. Accordingly, when the ground substrate is sapphire or SiC, it is a crystal having the surface of C-plane. When GaN is grown thereon, it grows in c-axis direction. Normally, the growth is carried out so that the surface becomes a flat (mirror surface) C-plane, and therefore the growth is referred to as C-plane growth. On C-plane sapphire ground substrate, GaN crystal of which surface is C-plane is grown.

[2. Random Facet Growth Method]

Japanese Patent Laying-Open No. 2001-102307 (Patent Document 1) discloses the following. Growth conditions are so set intentionally that they do not satisfy the mirror surface growth conditions, whereby multiple three-dimensional facet pits are naturally produced on the crystal surface, and grown while ensuring that facets are not buried. Dislocations are gathered at the bottom of the facet pits, so that they are reduced in the other portions. Thus, low dislocation density in the other portions is attained. Since the growth proceeds in c-axis direction, C-plane is the average growth plane. As used herein, a facet refers to a plane having low Miller indices except for C-plane.

A facet pit is a funnel-like recess having a shape of regular hexagonal cone or regular dodecagonal cone. In a regular hexagonal cone facet, six facet planes {1-101} or {11-22} having different Miller indices are gathered to form one pit.

A regular dodecagonal cone is formed by a combination of twelve facet planes {1-101} and {11-22}.

Each facet plane of a facet pit has a normal that is directed inward. The crystal grows in the direction of the normal. The dislocations extend in the growth direction. Accordingly, the dislocations extend inward and gather at the boundaries of the facets. Then, they slide along the boundary planes and gather at the bottom of the pit. A specific portion where the dislocations are gathered is created at the pit bottom. This is a portion where defects are gathered. While the pit bottom has high dislocation density, the other portions are deprived of dislocations and therefore have low dislocation density. At average, dislocation density is reduced to about $2 \times 10^7 cm^{-2}$.

This scheme is tentatively referred to as "the random facet method", as portions where dislocations gather (pit bottoms) are randomly produced on the crystal plane. This is the first of facet growth methods made by the present inventors. The facets naturally occur. The locations where pits are produced are random and cannot be controlled. A device must be manufactured selecting the portion with fewer defects. However, occurrence of the defects are determined by accidents. Further, since nothing enclose the dislocations, the dislocations once gathered may spread. Still further, as to the hexagonal cone pit, planar defects may occur in the angle of radiation of 60° immediately below the boundary lines. There have been such problems.

[3. Dot Mask Facet Growth Method]

Japanese Patent Laying-Open No. 2003-165799 "Single Crystal GaN Substrate, Method of Growing Same and Method of Producing Same" (Patent Document 2) is the second of the facet growth methods made by the present inventors. On a ground substrate, isolated dot-like masks ($SiO_2$) each having a diameter of about 10 μm to 40 μm are regularly arranged in a matrix with a pitch of about 100 μm to 400 μm. GaN is grown thereon by a vapor phase growth method. While being referred to as the "mask" herein, this mask has narrow covering portions and wide exposing portions contrary to the ELO mask (which has wide covering portions and small windows).

In addition, the pitch of the mask arrangement is not some Am but wider, i.e., about 100 μm to 400 μm. The phenomenon occurring on the masks is also contrasting. The crystal growth proceeds faster in the exposing portion of the ground substrate, while the growth proceeds slower in the covering portions ($SiO_2$). Accordingly, a facet pit where facets converge is produced at the mask-covering portion. The pit becomes greater as the growth proceeds, having its bottom on the covering portion. That is, the location where the facet pit is produced corresponds to the mask-covering portion. The location above the mask-covering portion corresponds to the pit bottom.

As the growth proceeds, dislocations moves in the normal direction of the facet planes, and reach facet boundaries. From the facet boundary, the dislocations moves to the facet bottom. The dislocations gather at the facet bottom, to form a closed defect gathering region H there. The facet bottom means the location above the mask. On the mask-covering portion, closed defect gathering region H is formed. Closed defect gathering region H is slightly smaller than the mask. By the mask, the position and size of closed defect gathering region H can be determined. The other portion of the facet slanting plane becomes a low defect single crystal region Z.

As the masks are formed as isolated dots and the facets are formed in a fashion of isolated circles, there is a portion that is not covered by the facets and where C-plane growth proceeds. While this portion is also low in dislocation density and it is a single crystal, it is different in various aspects from low defect single crystal region Z that is grown continuously from the facet plane. Therefore, this portion is referred to as a single crystal low dislocation extra region Y. In this method, the position of closed defect gathering region H can be determined from the beginning by the mask position. The size of closed defect gathering region H can also be determined by the size of the mask.

Furthermore, closed defect gathering region H formed continuously from the mask-covering portion is closed. Once the dislocations are accumulated in closed defect gathering region H, they will not spread by the progress of the crystal growth. This is why the term "closed" is used. Being different from Patent Document 1, dislocations gather at the bottom. Accordingly, no planar defects are produced under the boundaries of the facets. While the dislocation density is $10^6$ to $10^7$ $cm^{-2}$ at low defect single crystal region Z near closed defect gathering region H, at a portion away from closed defect gathering region H by 100 μm, the dislocation density is reduced to $10^4$ to $10^5$ $cm^{-2}$. Since the mask-covering portions being the origin of closed defect gathering regions H are present in a manner of isolated point "dots", the present method is referred to as the dot mask type herein.

[4. Stripe Mask Facet Growth Method]

Japanese Patent Laying-Open No. 2003-183100 "Single Crystal GaN Substrate, Method of Growing Single Crystal GaN, and Method of Producing Single Crystal GaN Substrate" (Patent Document 3) discloses the following. On a ground substrate, a plurality of masks (such as $SiO_2$) parallel to one another at regular intervals are formed, and GaN is grown by a vapor phase growth method thereon. It is different from Patent Document 2 in that the mask has a plurality of covering portions provided at regular intervals that are linearly parallel and that are continuous from one side to the other side of the ground substrate. It is the same in that the covering portions are smaller in the area than the exposing portions. However, while Patent Document 2 discloses the mask in which isolated covering portions are arranged regularly in a matrix, Patent Document 3 discloses the mask in which linear covering portions are arranged regularly in parallel to one another. The crystal is grown by a vapor phase growth method of the HVPE method or the MOCVD method.

In case of the HVPE method, in epitaxial growth, $NH_3$ partial pressure is 30 kPa and HCl partial pressure is 2 kPa (see paragraphs 229 and 291 of Patent Document 3). Alternatively, $NH_3$ partial pressure is 20 kPa or 25 kPa and HCl partial pressure is 2.5 kPa or 2.0 kPa (see paragraphs 311, 335 and 371 of Patent Document 3).

Crystal growth precedes in the exposing portions of the ground substrate, while crystal growth delays in the covering portions. Therefore, as GaN is grown, parallel mountain-shaped facets are produced, in which the covering portions are the valleys and the centers of the exposing portions are ridges. Parallel facet grooves, but not pyramid pits, are produced. A repetitive structure of parallel ridges and volleys similar to mountains is produced. Along the growth, dislocations slide downward on the sides of the facets, and collected at the valleys of the facets. The valleys are located immediately above the mask-covering portions. The location immediately above the covering portions are the regions where defects gather. Since there are a number of mask-covering portions in parallel to one another, the regions where defects gather are also produced in parallel to one another. The defects do not gather at a pit bottom, but they gather at the bottom of a V-groove. This is referred to as crystal defect gathering region H. It is not closed as closed dislocation gathering region H in Patent Document 2. Therefore, the term "closed" is not used.

Since the portions below facet slanting planes are deprived of dislocations, the portions except for dislocation gathering region H attain a low dislocation density. The slanting planes of a facet are determined, and they are significantly steep. Since the covering portions are parallel to one another, the portions where C-plane growth proceeds (single crystal low dislocation extra region Y) can completely be reduced to zero. Then, a repetitive structure HZHZH . . . of parallel low defect single crystal region Z and dislocation gathering region H is produced. While it depends on the Miller indices of the facet planes, as the slanting angle of a facet plane is about 50 degrees, the crystal becomes a parallel mountain shape having significantly high ridges and low valleys. As it is transparent, it has a shape in which a number of triangle columnar prisms are arranged side by side in parallel to one another. When a portion where C-plane growth proceeds is left at the intermediate portion of low defect single crystal region Z, a repetitive structure of HZYZHZYZH . . . is produced.

When light emitting devices are to be manufactured thereon, they may be formed on regions Z or Y where the defect density is low. In Patent Document 3, width h of defect gathering region H is 1 µm to 200 µm, while the width of the combination of low defect single crystal regions Z and C-plane growth region Y (y+2z) is 10 µm to 2000 µm. The spatial period (pitch p) of the structure of HZHZHZ . . . or HZYZHZYH . . . arrangement is 20 µm to 2000 µm. Since a facet plane has steep slanting angle of about 50 degrees, the height of the ridge is the degree of pitch p. For example, when p=2000 µm, the height of the ridge portion of the crystal will be about 2 mm and many concave and convex portions are present in the plate. The appearance is significantly different from a crystal obtained by normal vapor phase growth. Since the crystal immediately after the growth has great concave and convex portions, it is ground and polished to be a flat and smooth substrate crystal.

The crystal processed to be the flat and smooth substrate has parallel regions Z or ZYZ which have low dislocation density and which are single crystal. Accordingly, it has a structure suitable for manufacturing many devices on low defect single crystal regions Z. This is because low defect single crystal regions Z each has a width of 2000 µm, at a maximum. As 2000 µm corresponds to 2 mm and the size of a light emitting device chip is often 300 µm to 500 µm square, about three to five chips can be arranged next to each other in one line of low defect single crystal region Z.

As represented by GaN substrates, there are no large-size nitride semiconductor (AlGaInN) substrates having low dislocation density. While nitride semiconductor devices are formed on a foreign material substrate (sapphire, SiC), there are problems of cleavage, insulation, high defect density and the like. They are great obstacles in fabricating the nitride semiconductor devices.

In particular, as substrates for mass production, the substrates are required to have a great area, low defect density, and an excellent quality. To this end, there have been many attempts of fabricating low dislocation density nitride substrates of large size. However, it is not yet in actual use.

As substrates for electronic devices, desirably the dislocation density is not more than $1 \times 10^6 cm^{-2}$, or not more than $1 \times 10^5 cm^{-2}$, if possible. Therefore, the GaN substrate of the present inventors (Patent Document 3: Japanese Patent Laying-Open No. 2003-183100) in which dislocations are gathered to defect gathering region H so that surrounding portions become regions of low dislocation density is desirable.

In the GaN substrate based on Patent Document 3 of the present inventors, the dislocation density (at region Z) of $1 \times 10^6 cm^{-2}$ can stably be controlled. However, since low defect single crystal region Z and crystal defect gathering region H must be alternately present, it is difficult to form low defect regions having a large area, which is required for creating electronic devices and the like.

Patent Document 3 is the third of the facet growth methods made by the present inventors, and it is the most relevant to the present invention. In the stripe mask facet growth method of Patent Document 3, on a ground substrate, stripe mask patterns in which covering portions and exposing portions are regularly arranged in parallel to one another are arranged. Linear ridges and V-grooves (valleys) made of facet planes are formed thereon. While maintaining them, the facet growth of GaN is allowed to proceed. Defect gathering region H is created at the bottom of V-groove made of facet planes. Dislocations are gathered thereto, whereby dislocation density in surrounding low defect crystal region Z and C-plane growth region Y is reduced. The crystal growth provides a stripe-patterned plate having ridges and valleys arranged side by side, with concave and convex portions. By polishing the plate to abrade the ridges, a flat substrate is provided. In the GaN crystal processed to be the substrate, the width 2z of low defect single crystal regions Z, the combined width 2z+y of low defect single crystal regions Z and C-plane growth region Y, or pitch p is narrower than 2000 µm.

In the GaN substrate crystal according to Patent Document 3, stripe-like defect gathering regions H and low defect density regions are alternately present. Devices cannot be provided on defect gathering regions H. The devices can be provided only on low defect single crystal regions Z. However, the area of low defect density regions (Z and Y) is small, posing a problem in using the substrate as a GaN substrate for LEDs or electronic devices. Wider low defect single crystal regions Z are desired.

In the defect gathering growth method according to Patent Document 3, defect gathering region H is at the bottom of a groove, and low defect single crystal regions Z made by facet planes are formed around it. Defect gathering region H is essential for converting the other portions into low defect single crystal regions Z. Without defect gathering region H, low defect single crystal regions Z are not formed. If the distance (z or 2z+y) between defect gathering region H and defect gathering region H is increased for enlarging low defect single crystal regions Z, problems such as irregularity of the growth plane, occurrence of crystal defects and the like arise. That is, the above-described conditions of epitaxial growth are not applicable to the facet growth with great pitch p or width z of low defect single crystal region Z.

In the epitaxial growth of GaN according to the HVPE method of Patent Document 3, $NH_3$ partial pressure is 30 kPa and HCl partial pressure is 2 kPa (see paragraphs 229 and 291 of Patent Document 3). Alternatively, $NH_3$ partial pressure is 20 kPa or 25 kPa and HCl partial pressure is 2.5 kPa or 2.0 kpa (see paragraphs 311, 335 and 371 of Patent Document 3). Thus, the most frequently employed condition in Patent Document 3 is the typical condition wherein $NH_3$ partial pressure is 30 kpa and HCl partial pressure is 2 kPa. However, with such a condition, the facet growth cannot be stably performed on the ground substrate with a stripe mask having wide pitch p.

SUMMARY OF THE INVENTION

An object of the present invention is to adjust the growth condition so that stable facet growth is enabled even with a masking pitch of not smaller than 2020 μm and not greater than 10300, to thereby produce a nitride semiconductor substrate crystal having wide low defect single crystal region Z. In 2020 μm, 20 μm is the minimum width of defect gathering region H formed above a stripe covering portion. Since pitch p is determined including width h of defect gathering region H (p=z+h), the minimum value of low defect single crystal region Z is 2000 μm. On the other hand, in 10300 μm, 300 μm is the maximum value of width h of defect gathering region H. The maximum value of width z of low defect single crystal region Z is 10000 μm.

A manufacturing method of a nitride substrate includes the steps of: preparing a ground substrate having at least threefold rotational symmetry; forming, on the ground substrate, a mask having covering portions each having a width s=2020 μm to 400 μm and exposing portions each having a width of 2000 μm to 10000 μm arranged in parallel to one another at regular intervals with a constant pitch p=2020 μm to 10300 μm; and placing the ground substrate having the mask formed thereon in a reactor having at least one of a Ga boat, an In boat and an Al boat, and heating the ground substrate to a temperature of 850° C. to 1100° C. In the step of forming the mask, the exposing portions each interposed between the covering portions are completely exposing portions that completely expose, or partially exposing portions that partially expose and partially cover by provision of a plurality of windows. In the step of heating the ground substrate, HCl is supplied into the reactor so that partial pressure $P_{HCl}$ thereof satisfies (1.5+ 0.0005 p) kPa$\leq P_{HCl}\leq$(4+0.0005 p) kPa, to generate at least one of GaCl, InCl and $AlCl_3$. Also, $NH_3$ is supplied into the reactor so that partial pressure $P_{NH3}$ thereof satisfies (15– 0.0009p) kPa$\leq P_{NH3}\leq$(26–0.0017 p) kPa, to allow $NH_3$ to react with at least one of the GaCl, InCl and $AlCl_3$. Thus, an $Al_xGa_yIn_{1-x-y}N$ crystal (0$\leq$x<1, 0<y$\leq$1) is grown on the ground substrate having the mask formed, and a ridge-volley structure including facet planes and a plurality of ridges and valleys parallel to one another is formed. The ridges and valleys have tops over intermediate portions of the exposing portions and bottoms over the covering portions, respectively. The $Al_xGa_yIn_{1-x-y}N$ crystal is grown so that portions immediately above the covering portions become crystal defect gathering regions where dislocations are gathered and portions above the exposing portions and immediately below the facet planes become low defect single crystal regions where the dislocations are fewer than in the crystal defect gathering regions, and so that the ridge-valley structure is not buried while a height of the volleys from the ground substrate is allowed to exceed 2.5 (p–s).

Preferably, the manufacturing method of the nitride substrate further includes a step of removing the ridges by grinding or polishing, thereby producing a flat and smooth nitride substrate crystal of a uniform thickness having the ground substrate and a structure where the crystal defect gathering region and the low defect single crystal region being linear and parallel to each other are repeated with the pitch p.

Preferably, the manufacturing method of the nitride substrate further includes a step of polishing or etching the flat and smooth nitride substrate crystal, thereby removing the ground substrate and the mask, and thereby producing a free-standing nitride substrate crystal formed by the structure where the crystal defect gathering region and the low defect single crystal region being linear and parallel to each other are repeated with the pitch p.

Preferably, the manufacturing method of the nitride substrate further includes a step of cutting the free-standing nitride substrate crystal perpendicularly to a crystal growth direction, thereby producing a plurality of free-standing nitride substrate crystals having the structure where the crystal defect gathering region and the low defect single crystal region being linear and parallel to each other are repeated with the pitch p.

In the manufacturing method of the nitride substrate, in the step of heating the ground substrate, the facet planes, and a C-plane may be formed above each of the exposing portions, and the $Al_xGa_yIn_{1-x-y}N$ crystal may be grown so that portions immediately below the facet planes become the low defect single crystal regions and a portion immediately below the C-plane becomes a C-plane growth region.

Preferably, the manufacturing method of the nitride substrate further includes a step of removing the ridges by grinding or polishing, thereby producing a flat and smooth nitride substrate crystal of a uniform thickness having the ground substrate and a structure where the crystal defect gathering region, the low defect single crystal region, the C-plane growth region and the low defect single crystal region being linear and parallel to one another are repeated with the pitch p.

Preferably, the manufacturing method of the nitride substrate further includes a step of polishing or etching the flat and smooth nitride substrate crystal, thereby removing the ground substrate and the mask, and thereby producing a free-standing nitride substrate crystal formed by the structure where the crystal defect gathering region, the low defect single crystal region, the C-plane growth region and the low defect single crystal region being linear and parallel to one another are repeated with the pitch p.

Preferably, the manufacturing method of the nitride substrate further includes a step of cutting the free-standing nitride substrate crystal perpendicularly to a crystal growth direction, thereby producing a plurality of free-standing nitride substrate crystals having the structure where the crystal defect gathering region, the low defect single crystal region, the C-plane growth region and the low defect single crystal region being linear and parallel to one another are repeated with the pitch p.

A nitride substrate according to the present invention includes: crystal defect gathering regions having crystal defects gathered, being continuous from a front side to a rear side of the substrate in a thickness direction, and extending linearly and in parallel to one another, each having a width of 20 μm to 300 μm; and low defect single crystal regions having fewer crystal defects than the crystal defect gathering regions, being continuous from the front side to the rear side of the substrate in the thickness direction, each having a width of 2000 μm to 10000 μm. The nitride substrate has a structure where the crystal defect gathering region and the low defect single crystal region are repeated with a pitch p=2020 μm to 10300 μm.

Preferably, the nitride substrate has n-type conductivity and a specific resistance of not greater than 0.1Ω·cm.

A nitride-based semiconductor device according to the present invention has one of the following devices fabricated on the above-described nitride substrate: a light emitting diode, a laser diode, a rectifier, a bipolar transistor, a field-effect transistor, an HEMT (High Electron Mobility Transistor), a temperature sensor, a pressure sensor, a radiation sensor, and a visible-ultraviolet light detector, a SAW (Surface Acoustic Wave) device, a vibrator, a resonator; an oscillator, an MEMS (Micro Electro Mechanical System) component, and a piezoelectric actuator. That is, the nitride-based semiconductor device according to the present invention includes the nitride substrate according to the present invention.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 13 shows only three units of the structure.

DESCRIPTION OF THE PREFERRED EMBODIMENTS

According to the present invention, on a ground substrate U, a stripe mask is formed. The mask has covering portions S each having a width of 20 $\mu$m to 400 $\mu$m arranged parallel to one another by pitch p ($\mu$m) in a range of 2020 $\mu$m to 10300 $\mu$m, and wide exposing portions (including complete exposure and partial exposure) E each arranged between covering portions S. The substrate temperature of 850° C. to 1100° C. (preferably, 1010° C. to 1070° C.) is attained while ammonia partial pressure $P_{NH3}$ as a function of pitch p is (15−0.0009 p) kPa to (26−0.0017 p) kPa and HCl partial pressure is in a range of (1.5+0.0005 p) kPa to (4+0.0005) kPa. According to the HVPE method, defect gathering regions H are generated on covering portions S and facets F having parallel ridges are formed on exposing portions E. A nitride semiconductor crystal is grown while maintaining facet F. Here, a portion immediately below the facet and above exposing portion E is low defect single crystal region Z. In this manner, $NH_3$ partial pressure and HCl partial pressure are changed depending on pitch p of the stripe mask, so that stable and uniform facet growth is carried out even with wide pitch p (2020 $\mu$m to 10300 $\mu$m).

The foregoing is the gist of the novel portion of the present invention. The above conditions are empirically found by performing numerous experiments. The grounds thereof will be described later referring to Examples and Comparative Examples.

Starting with the detailed description of the facet growth method of the stripe mask, the significance of the novel portion is further clarified.

Figure 1:
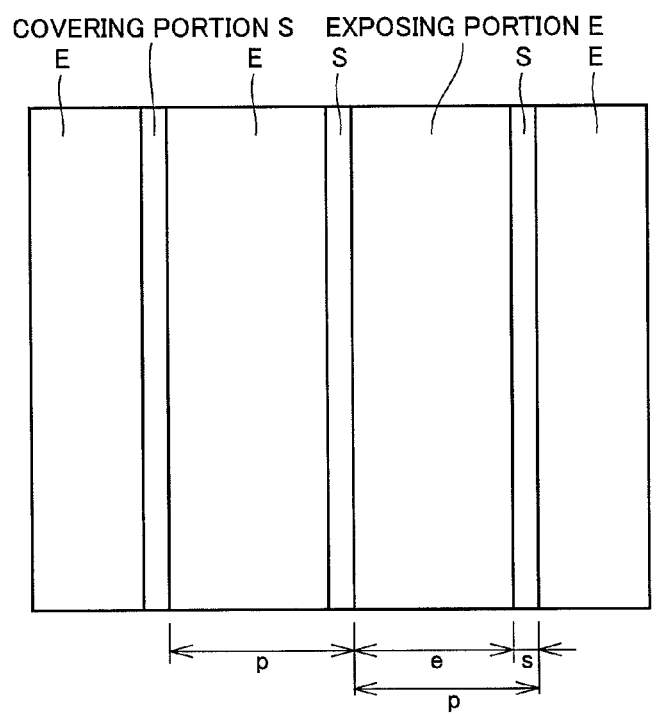
FIG. 1 is a plan view of part of a ground substrate U, in which a stripe mask creating a plurality of parallel and linear covering portions S and exposing portions E on ground substrate U is formed.

FIG. 1 is a plan view of ground substrate U on which a stripe mask having a plurality of parallel covering portions S are formed. While rectangular ground substrate U is illustrated, only part of ground substrate U is shown herein and the entire shape of ground substrate U may be rectangular or circular. Disposed between covering portions S is exposing portion E. In exposing portion E, in some cases ground substrate U is completely exposed, and in other cases ground substrate U is partially exposed and partially covered by an ELO mask. As used herein, both the complete exposure and the partial exposure are referred to as exposing portion E. When there is the ELO mask in exposing portions E, while it seems as if ground substrate U is entirely covered, each exposing portion E is provided with small windows of about 0.5 $\mu$m to 2 $\mu$m regularly arranged by intervals of 1 $\mu$m to 3 $\mu$m. In the present invention, since the width of each exposing portion E is greater than 2000 $\mu$m and the width of each covering portion S is not less than 20 $\mu$m, exposing portions E having many small windows and covering portions S having wide width and with complete coverage can spatially correctly be distinguished from each other. It is to be noted that, in the following, exposing portions E include both the complete exposure and the partial exposure with the ELO mask.

Figure 4:
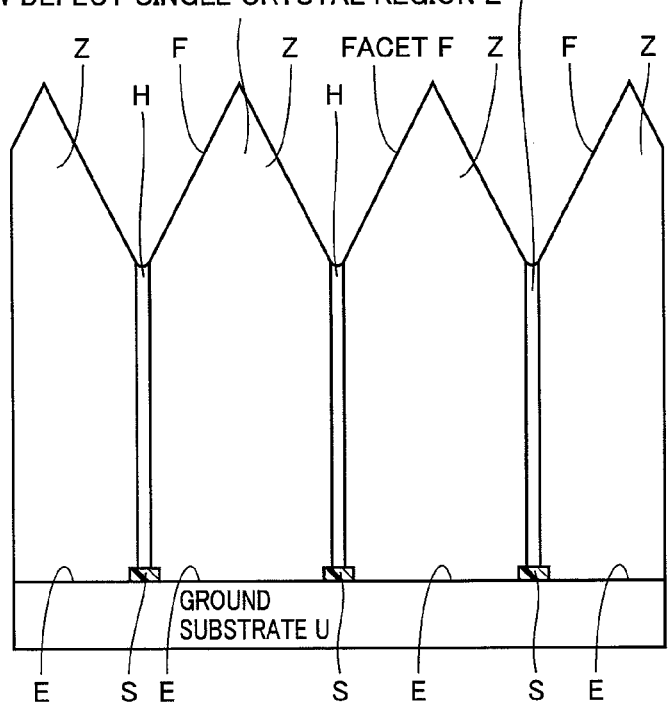
FIG. 4 is a vertical cross-sectional view of a crystal in a state attained by: forming a plurality of parallel and linear covering portions S each having width s with pitch p; facet-growing GaN according to the HVPE method on ground substrate U having exposing portions E each having width e and covering portions S each having width s; and forming defect gathering regions H on covering portions S and forming low defect single crystal regions Z on exposing portions E, thereby forming a ZHZH . . . structure of repetitive ridges and valleys.

FIG. 4 is a cross-sectional view in the same state. Ground substrate U is required to have at least threefold rotational symmetry. Ground substrate U is a single crystal substrate having threefold or sixfold rotational symmetry. Sapphire ($\alpha$-$Al_2O_3$) of C-plane, GaAs of (111) plane, SiC of C-plane or the like can be employed as ground substrate U. Sapphire is trigonal system and SiC is hexagonal system, wherein C-plane has threefold and sixfold rotational symmetry, respectively. While GaAs is cubic system, (111) plane has threefold rotational symmetry.

In the following, an example in which GaAs having (111) Ga plane is used as ground substrate U will be described. However, ground substrate U is not limited thereto. Mask may be $SiO_2$, SiN, AlN, $Al_2O_3$ or the like. Width of parallel covering portion S is denoted by s. The width of exposing portion E where ground substrate U is exposed is denoted by e. One spatial period (pitch) is represented by p. P=e+s. As the mask is formed by a group of parallel covering portions S, the mask is referred to as the stripe mask.

For ease of description, three-dimensional coordinates u, v, w are defined. The extending direction of covering portions S is v, and the direction perpendicular to covering portions S is u. The thickness direction is w. Covering portions S are arranged with regular intervals from one another in u-direction.

While Patent Document 3 is also directed to the facet growth method using the stripe mask, there has been the limitation of pitch p<2000 μm. In contrast, according to the present invention, p≦2020 μm. The growth method for achieving this is the special conditions described above.

Under the above-described conditions, GaN is facet-grown according to the HVPE method on ground substrate U with the mask, to produce low defect single crystal regions Z and defect gathering regions H on exposing portions E and covering portions S, respectively. In terms of positional relationship, covering portions S correspond to defect gathering regions H while exposing portions E (including complete exposure and partial exposure) correspond to the portions above low defect single crystal regions Z. On the other hand, their widths are not necessarily the same. Normally, width h of each defect gathering region H is narrower than width s of each covering portion S (h<s).

Figure 2:
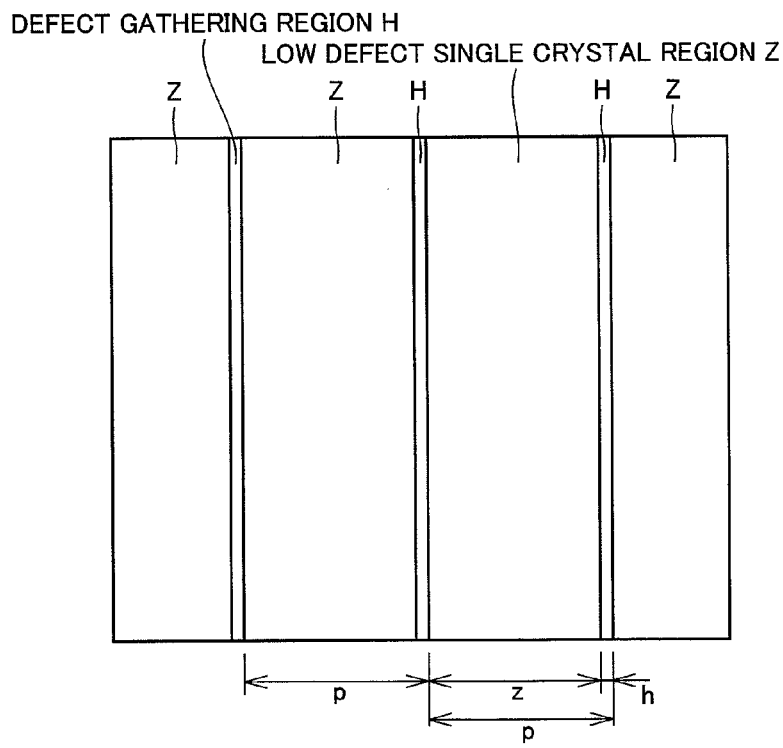
FIG. 2 is a plan view showing a structure of part of a crystal, obtained after growing GaN by the facet growth according to the HVPE method on ground substrate U provided with the stripe mask, and removing ground substrate U and ridge/valley portions.

As shown in FIG. 4, the GaN crystal is grown thickly. A ZHZH . . . structure in which low defect single crystal region Z and defect gathering region H are repeated is formed. After such a thick crystal is grown, ridge (facet ridge) portions are removed by polishing. Ground substrate U is also removed by polishing or etching. A thick and flat crystal having a circular or rectangular shape is obtained. The crystal is thinly sliced to obtain a plurality of crystal substrates (wafers). FIG. 2 is a plan view of a crystal substrate (wafer) as thinly cut. It has the ZHZHZH . . . structure in which low defect single crystal region Z having wide width and defect gathering region H having narrow width are arranged repetitively and alternately. FIG. 2 is also a partial view, and the entire shape may be a circular wafer or it may be a rectangular wafer. Defect gathering regions H are formed in parallel to one another. Since defect gathering regions H are formed on the masking portions, pitch p is the same as the masking pitch. On the other hand, width h of each defect gathering region H is not the same as width s of each covering portion S, but narrower (h<s). Width z of each low defect single crystal region Z is wider than width e of each exposing portion E (z>e).

Figure 5:
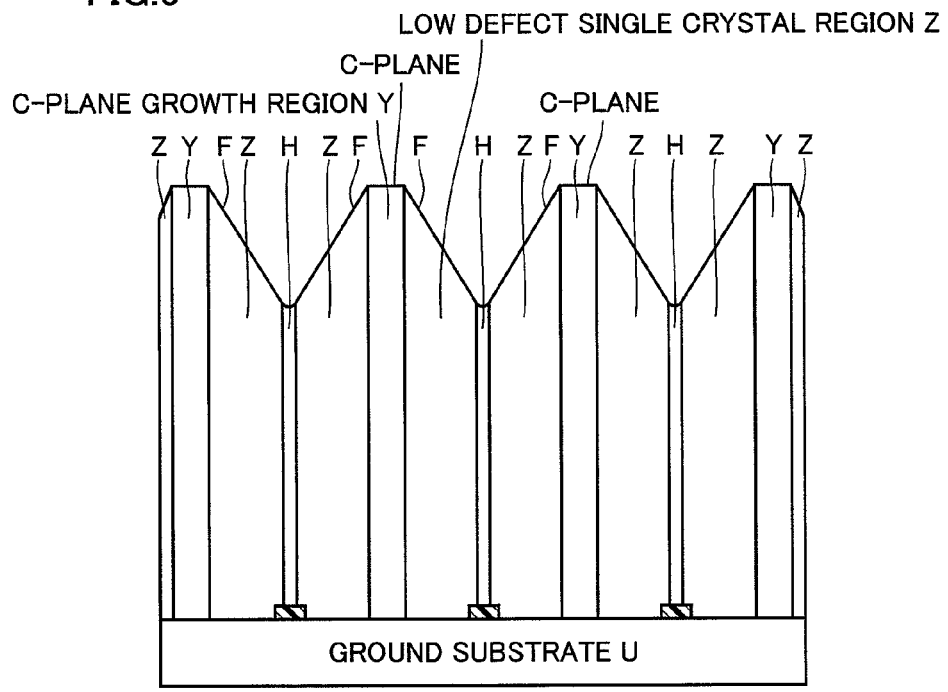
FIG. 5 is a vertical cross-sectional view of a crystal in a state attained by: forming a plurality of parallel and linear covering portions S each having width s with pitch p; facet-growing GaN according to the HVPE method on ground substrate U having exposing portions E each having width e and covering portions S each having width s; and forming defect gathering regions H on covering portions S and forming low defect single crystal region Z, C-plane growth region Y and low defect single crystal region Z on each of exposing portions E, thereby forming a ZYZHZYZH . . . structure of repetitive ridges and valleys.
Figure 6:
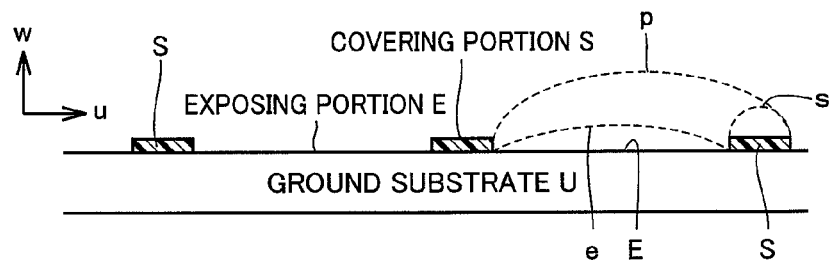
FIG. 6 is a view used for describing the facet growth method, and it is a vertical cross-sectional view of ground substrate U with the stripe mask, in which parallel and linear covering portions S each having width s are provided on ground substrate U, and exposing portions E each having width e are each provided between covering portions S.

FIGS. 2 and 4 each shows an ideal state where only two phases of defect gathering region H and low defect single crystal region Z are present. However, in some cases C-plane growth region Y is also present. This is a three-phase structure. FIG. 5 shows such a case. In this case, the substrate obtained by polishing and slicing after the growth has the structure shown in FIG. 3. This is a repetitive structure of ZYZHZYZH . . . formed by low defect single crystal region Z, C-plane growth region Y, low defect single crystal region Z, defect gathering region H. In this case, p=e+s=z+y+z+h. In this case also, the ridge portions of facets F are removed and ground substrate U is removed to obtain a flat crystal substrate, which is then thinly sliced, thereby becoming wafers.

Figure 3:
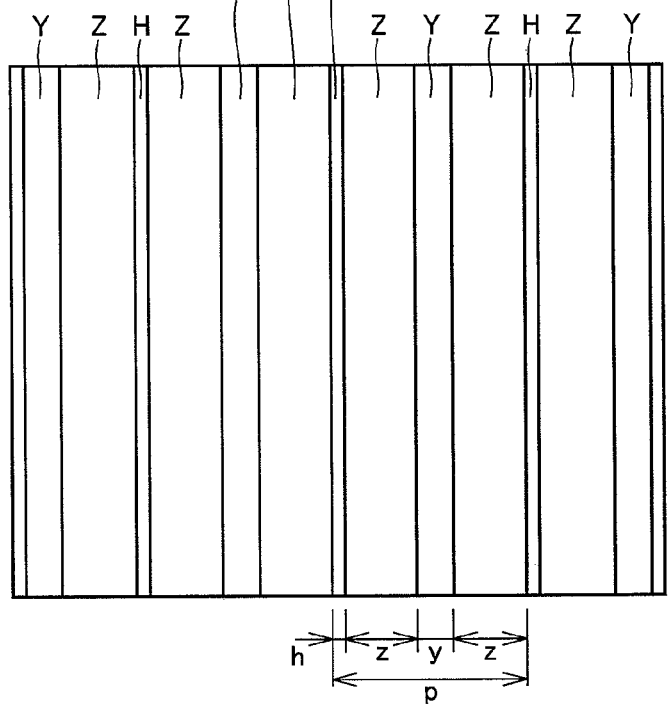
FIG. 3 is a plan view showing a structure of part of a crystal, obtained after growing GaN by the facet growth according to the HVPE method on ground substrate U provided with the stripe mask, and removing ground substrate U and ridge/valley portions.

This is what is shown in FIG. 3. This is also included in the scope of the present invention. However, it is preferable that C-plane growth region Y is not present. That is, width y of C-plane growth region Y is most preferably y=0. For the sake of clarity, the following description is given on the basis of y=0. In this case, masking pitch p, width e of exposing portion E, width s of covering portion s, width h of defect gathering region H, width z of low defect single crystal region Z always satisfy the equation p=e+s=z+h.

Figure 7:
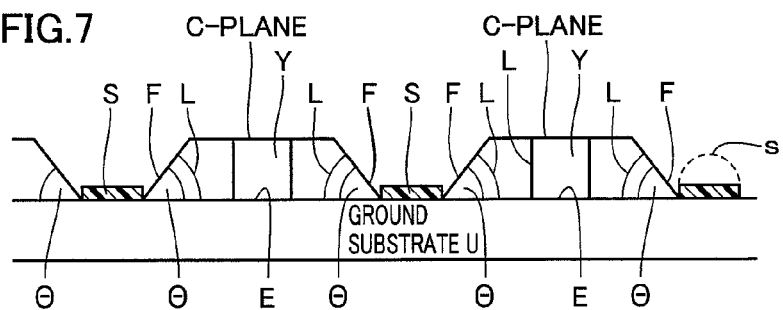
FIG. 7 is a view used for describing the facet growth method, and it is a vertical cross-sectional view in a state where: covering portions S each having width s and exposing portions E each having width e are provided on ground substrate U; GaN is facet-grown on ground substrate U by the HVPE method; GaN starts to grow on each exposing portion E; parallel rib-like crystals each formed by facets F and C-plane are produced on exposing portions E; and dislocations L extend upward.

Referring to partial cross-sectional views of FIGS. 6-10, the stripe mask facet growth method is described. When GaN is grown by vapor phase growth on ground substrate U with the mask according to the HVPE method, firstly GaN crystal grain is produced only on each exposing portion E (including complete exposure and exposure with the ELO mask). The crystal grain becomes a nucleus, and becomes a GaN thin film. As a GaN crystal is hardly produced on each covering portion S, covering portion S defines an edge of the crystal thin film. FIG. 7 shows a state where each crystal thin film has its edges fixed by covering portions S and grows upward. The flat portion at the top plane of the crystal is C-plane. The slanting planes are facets F. A facet F refers to a plane having low Miller indices except for C-plane. For example, a plane having low Miller indices such as {1-102}, {1-101}, {1-10n}, {111-22} {11-2n} or the like (where n is an integer). Naturally, it is defined by the extending direction of the stripe mask on ground substrate U.

In order to avoid confusion, Miller indices notation is briefly described. A crystal structure having symmetry such as trigonal system and hexagonal system is expressed by four-index notation or three-index notation. Here, four-index notation is employed. The threefold rotational symmetry axis is c-axis. There are three principal axes each perpendicular to c-axis and forming an angle of 120 degrees. Two of the three principal axes are referred to as a-axis and b-axis. The other one is referred to as d-axis herein. A-, b-, and d-axes are equal principal axes each forming 120 degrees, while c-axis is a unique axis perpendicular to them. A-, b-, and d-axes have the same unit length, which is referred to as a-axis length. The unit length of c-axis is referred to as c-axis length. The reciprocal of an intercept of a certain crystal plane intersecting each a-, b-, d-, and c- axis is referred to as Miller index. That is, when intercepts are a/h, b/k, d/m, and c/n, the plane is expressed by the indices (hkmn). As one plane intersects three axes that are on the identical plane and that form 120 degrees between each other, naturally there is a zero-sum rule of h+k+m=0. There are no limitations on n.

Round brackets (hkmn) are used to express an individual plane. Curly brackets {hkmn} are used to express a group of planes. The expression of a group of planes {hkmn} means a group of all individual planes that can be achieved from (hkmn) by symmetric operation allowed for the crystal. Accordingly, if there is threefold rotational symmetry, {hkmn} and {kmhn} are equivalent, while (hkmn) and (kmnh) are not.

Angle brackets <hkmn> are used to express a group of directions. Square brackets [hkmn] are used to express an individual direction. Direction [hkmn] can be defined as a direction perpendicular to plane (hkmn).

The slanting plane shown in FIG. 7 is facet plane F, and there are several possible planes. Here, the slanting angle of facet F relative to ground substrate U is denoted by Θ. Facet angle Θ will be detailed later. Along with the growth of the thin film, dislocations L also extend upward or diagonally upward. Dislocations L extend in the same direction as the growth direction. As the growth is limited to exposing portions E, the thickness of facet F increases perpendicularly to the plane. In facet plane F, the growth direction is the direction perpendicular to the plane. The growth direction and the extending direction of dislocations L are the same. That is, in facet F, dislocations L extend orthogonally outward. The dislocations L having moved upward changes the direction orthogonally outward. They extend together with the surface of facet F. Significant proportions of the peak of dislocations L present on facet plane F. When the peak of dislocations L is present in C-plane or facet plane F, it is expressed that the dislocations L accompany the plane. Dislocations L are continuous, and starting edge thereof is at the boundary between ground substrate U and ending edge thereof is at that plane (F or C). Accordingly, dislocations L can be regarded as "accompanying".

Figure 8:
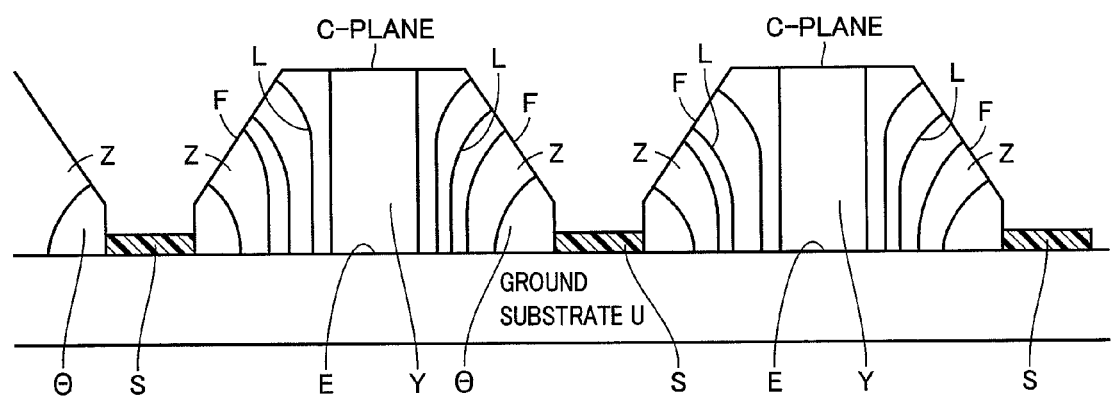
FIG. 8 is a view used for describing the facet growth method, and it is a vertical cross-sectional view in a state where: covering portions S each having width s and exposing portions E each having width e are provided on ground substrate U; GaN is facet-grown on ground substrate U by the HVPE method; parallel rib-like crystals each formed by facets F and C-plane are produced further higher on exposing portions E; part of dislocations L change the direction and follow facet planes F; and a perpendicular sidewall is produced at each boundary between covering portion S and exposing portion E.

This continues until the state of FIG. 8 is attained. Here, a wall perpendicular to covering portion S is produced. As facets F extend orthogonally, C-plane portion becomes narrower. C-plane portion is reduced and facet planes F are increased. Since C-plane turns to facet planes F, many of dislocations L accompanying C-plane becomes dislocations L accompanying facet planes F. Many of dislocations L move orthogonally outward with facet planes F.

Figure 9:
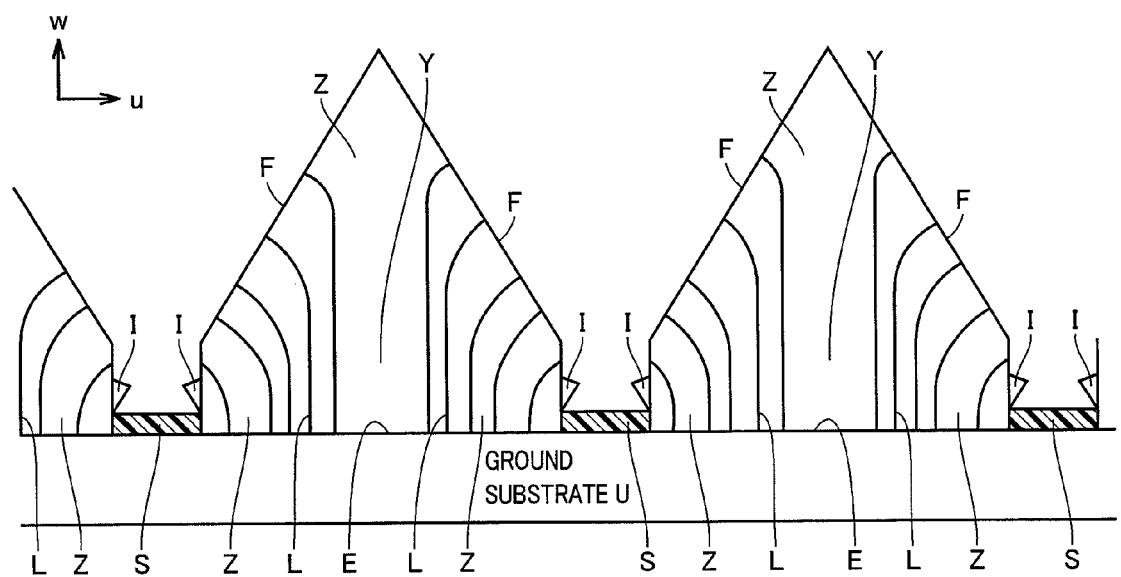
FIG. 9 is a view used for describing the facet growth method, and it is a vertical cross-sectional view in a state where: covering portions S each having width s and exposing portions E each having width e are provided on ground substrate U; GaN is facet-grown on ground substrate U by the HVPE method; parallel rib-like crystals each formed only by facet planes F are produced further higher on exposing portions E; part of dislocations L change the direction outward; and a protrusion I is produced at the perpendicular sidewall at each boundary between covering portion S and exposing portion E.

As shown in FIG. 9, as facet planes F extend laterally, the flat C-plane disappears. The adjacent facet planes F, F combine to form a ridge having a sharp tip. All dislocations L having been accompanying C-plane and extending upward becomes dislocations L that accompany facet planes F.

Until adjacent facet planes F, F combine and form the ridge as shown in FIG. 9, crystal growth on covering portion S does not occur. At the perpendicular wall inward protrusion I is produced over covering portion S. Protrusion I serves as a seed, and crystal growth also starts on covering portion S. This portion is buried with time delay. Therefore, a clear boundary is formed between this portion and the growth-advancing portion. This boundary prevents once-gathered dislocations L from being spread again and exiting to the outside. The crystal appears very differently between the outside (Z) and the inside (H) of the boundary.

It is now known that the orientation of the crystal formed at a portion above covering portion S is opposite to that of the other portions. The crystals are very different in height between the portion above covering portion S and the portion above exposing portion E. That is, the difference in height between covering portion S and exposing portion E is substantially equal to the height of facet plane F. While this may not be a very rigorous condition when width e of exposing portion E is narrow, it may constitute a significant difficulty when width e of exposing portion E is wide, since wide and uniform facet plane F must be formed and maintained.

Figure 10:
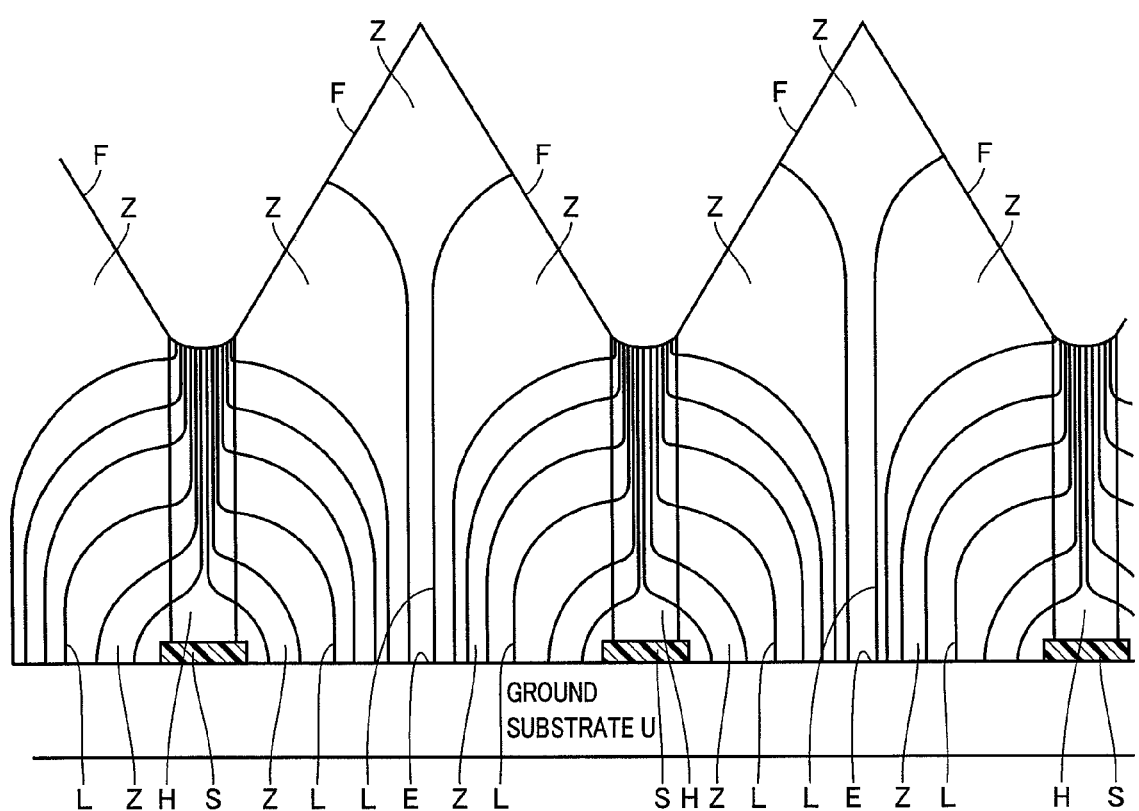
FIG. 10 is a view used for describing the facet growth method, and it is a vertical cross-sectional view in a state where: covering portions S each having width s and exposing portions E each having width e are provided on ground substrate U; GaN is facet-grown on ground substrate U by the HVPE method; parallel rib-like crystals each formed only by facet planes F are produced further higher on exposing portions E; dislocations L are expelled from facets F; and defect gathering regions H where dislocations L are gathered are created at covering portions S.

As the crystal grows in the normal direction of facet plane F while maintaining the slant of facet plane F, dislocations L move to the outside of facet plane F. They move to the portion above covering portion S. Here, steep slant is no more present. Therefore, movement of dislocations L in the orthogonal upward direction does not occur. Thus, dislocations L are accumulated in the portion (H) above covering portion S. Dislocations L are gradually condensed into this portion (H). As shown in FIG. 10, defect gathering region H where dislocations are gathered is formed above covering portion S. As the crystal grows upward, dislocations L increasingly exit from facet plane F toward defect gathering region H.

Accordingly, dislocations L are gradually reduced in the portion (Z) below facet F. On the other hand, dislocation density is gradually increased in defect gathering region H above covering portion S. Though dislocations L once produced during the crystal growth gradually disappear, the speed thereof is very slow. Accordingly, by gathering dislocations L at defect gathering region H, dislocations L in the other portion (low defect single crystal region Z) can significantly be reduced.

The foregoing is the outline of the dislocation reduction action by the stripe mask facet method. The foregoing description is given about an ideal case. In practice, there are many variations and dislocation density of low defect single crystal region Z does not perfectly become 0. However, the scheme is excellent in that the original dislocation density is reduced to about $1/100$ to $1/1000$.

The ideal facet growth is further discussed. Though the facet growth does not proceed in practice as in the ideal case, the facet growth can mathematically treated to some degree, whereby anticipation is possible. Therefore, the ideal case is discussed now.

Bilaterally symmetric crystal growth occurs relative to a midpoint M of exposing portion E. Accordingly, only the growth in half the region should be discussed. As discussed referring to FIGS. 9 and 10, the upwardly proceeding dislocations change the proceeding direction when they are just at the boundary between facet F and C-plane. As facet F extends from the bottom, dislocations L nearer to covering portion S change the direction to the facet plane normal direction, at a lower position and at earlier timing. Dislocations L nearer to midpoint M change the direction to the facet plane normal direction, at a higher position and at later timing. The boundary point between C-plane and facet F where the direction is changed must always be on a line starting from an end of covering portion S diagonally parallel to the facet slant. This is the important point.

Figure 11:
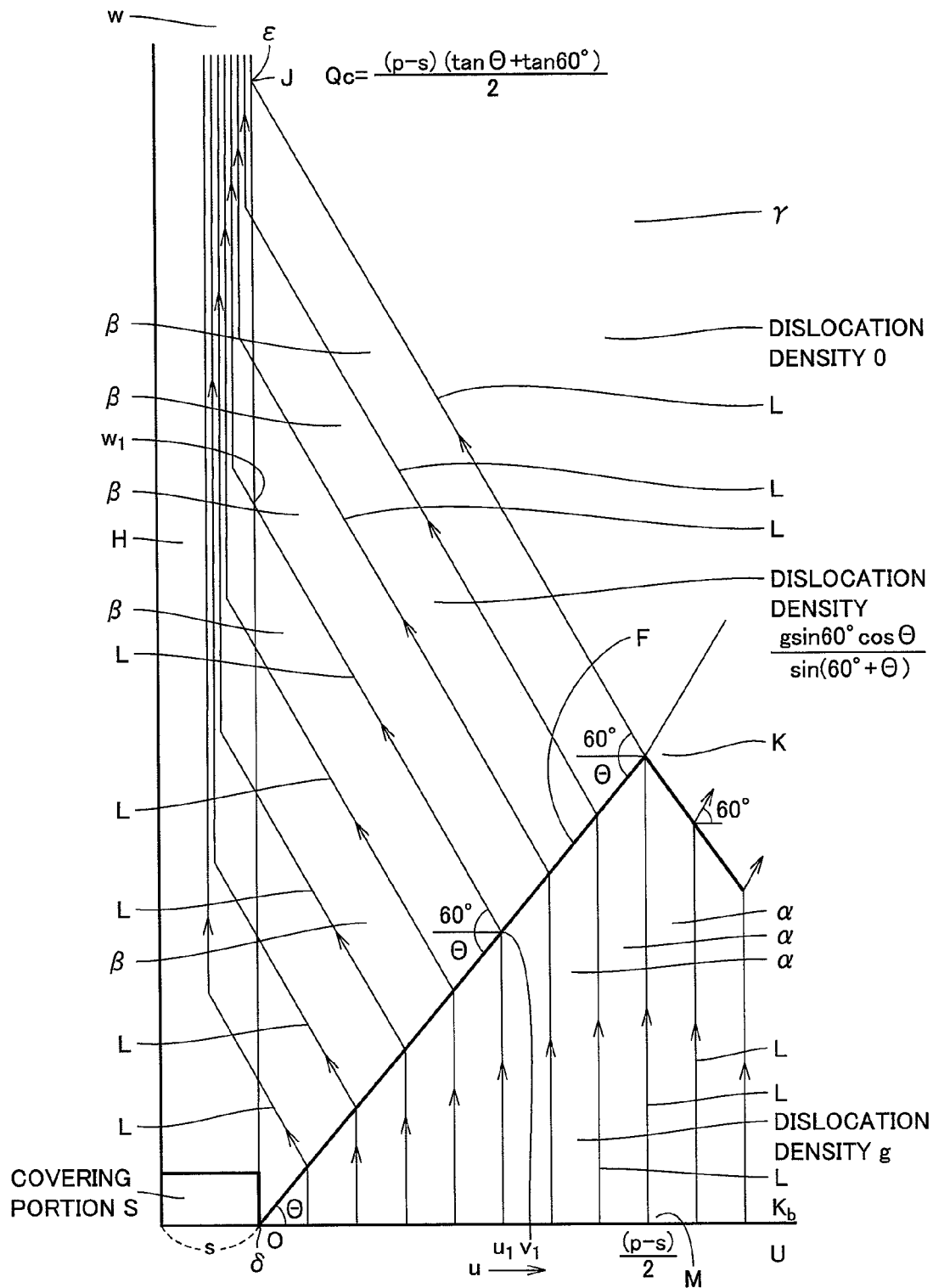
FIG. 11 is an explanatory view used for describing the following: when GaN is facet-grown on ground substrate U having the stripe mask formed, initially growth does not occur on covering portions S and crystal growth only occurs on exposing portions E, whereby facets F are formed. Movement of dislocations L occurs in the growth direction of facets F and dislocations L are collected at defect gathering regions H, whereby, below low defect single crystal region Z, dislocation density becomes lower as height w is higher.

FIG. 11 shows only the half of covering portion S and exposing portion E. As described above, exposing portion E includes complete exposure and partial exposure with the ELO mask, and collectively refers to them. The horizontal axis is the direction crossing covering portion S and exposing portion E. Origin O is set on the boundary between covering portion S and exposing portion E. With reference thereto, three-dimensional coordinates (u, v, w) are defined. Facet plane F originating from origin O is denoted by OK. K refers to the vertex of the facet ridge. A point on u-axis immediately below vertex K is denoted by M. M is the midpoint in exposing portion E.

An angle formed between facet F and the substrate is denoted by $\Theta$. $\Theta$ is determined by the Miller indices of facet F. This will be discussed later. $\angle KOM = \Theta$. The parallel vertical or diagonal lines express dislocations L. Dislocation L produced at a point where $u = u_1$ extends upward, and intersects facet line OK at point $V_1$. The growth has been upward up to the point, and therefore dislocation L is also upward. Thereafter, dislocation L extends with facet plane F, changing its direction to the direction forming an angle of about 60 degrees relative to the horizontal line. Dislocation L extends with facet F, and enters defect gathering region H at point $w_1$. That is, dislocation L draws a polygonal line along $u_1 v_1 w_1$, and enters defect gathering region H. Accordingly, dislocations L in defect gathering region H are increased as the position is higher.

Dislocations L are produced at boundary $K_b$ between the GaN crystal and ground substrate U. Since they are produced naturally, dislocation density is not uniform here. However, for the sake of clarity, discussion is proceeded assuming that the dislocation density of the naturally produced dislocations is uniform. The uniform dislocation density of the dislocations produced at boundary $K_b$ is denoted by g. Keeping this density, dislocations extend upward. The dislocation density is constant until dislocations reach OK. Inside triangle OMK, dislocation density is g.

Dislocations L extend in the growth direction. The growth direction of facet F is the normal direction. The normal means a ray that is outwardly directed and perpendicular to the plane. Accordingly, thereafter, dislocations L extend in the diagonally upward direction forming an angle of 60 degrees relative to the horizontal line. Dislocations L extend orthogonally outward. Dislocations L change the direction by about 30 degrees at facet plane F. Dislocations L are tilted by 60 degrees relative to the horizontal line.

Point K is the vertex of facet plane F, and dislocations L do not extend over that point vertically. This means that dislocation density above line JK is 0. Accordingly, above exposing portion E, there are regions having different dislocation density in three stages. The lowermost portion, i.e., triangle OKM, is an initial portion ($\alpha$) having high dislocation density. Triangle JKO is a transition portion ($\beta$) having intermediate dislocation density. The portion above JK is an excellent quality portion ($\gamma$) having zero dislocation density.

Figure 12:
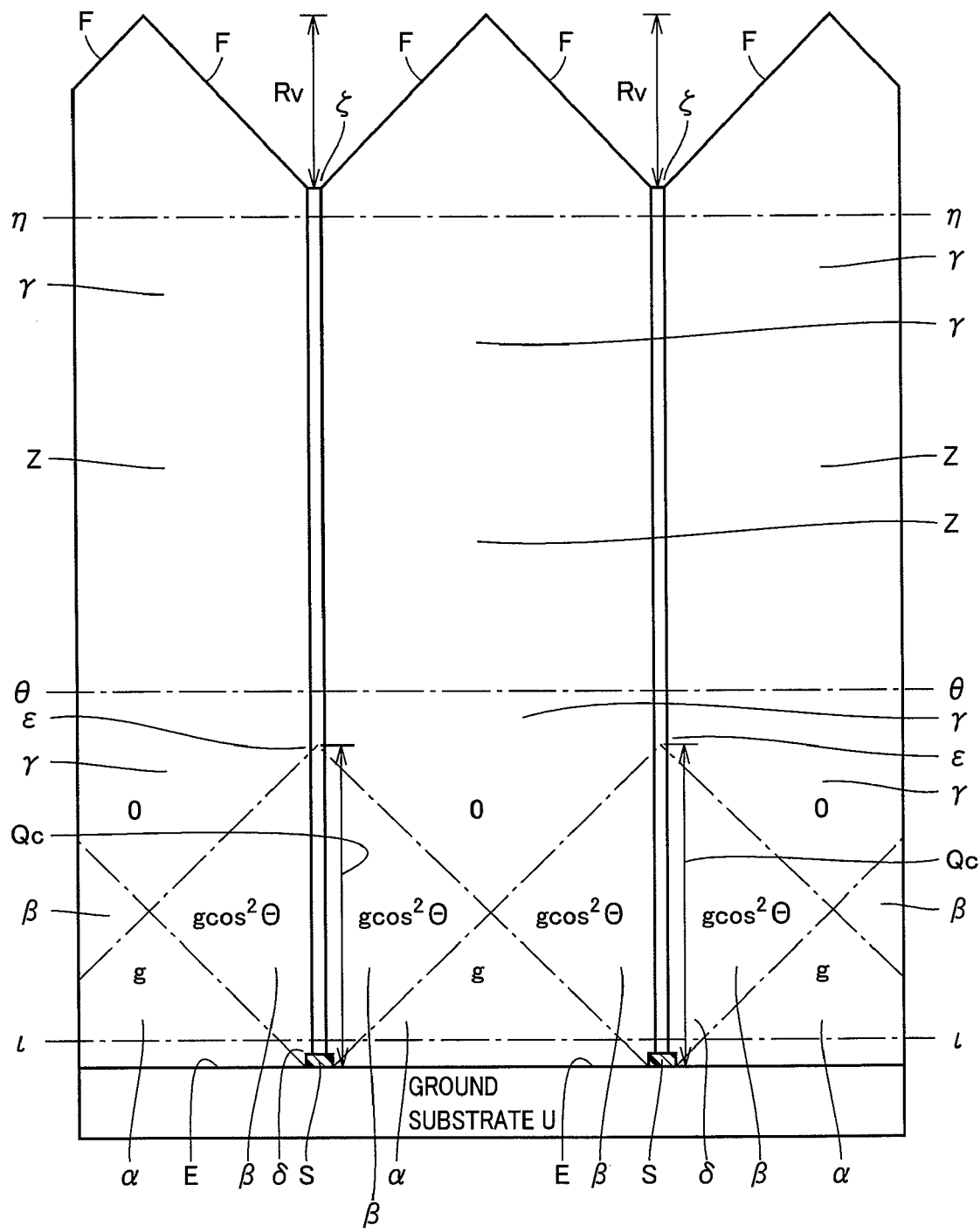
FIG. 12 is a vertical cross-sectional view of part of facet-grown GaN crystal, used for describing the following. As the GaN is facet-grown on ground substrate U having the stripe mask formed, low defect single crystal regions Z with reduced dislocations L are formed on exposing portions E and defect gathering regions H with gathered dislocations L are formed on covering portions S. As can be calculated referring to FIG. 11, below low defect single crystal region Z, a portion ($\alpha$) where dislocation density is original g, a portion ($\beta$) where dislocation density is gcos 2$\Theta$, and a portion ($\gamma$) where dislocation density is 0 are created.

FIG. 12 shows a crystal having a plurality of facet ridges. It further shows a portion above the portion shown in FIG. 11. A triangle near ground substrate U is initial portion ($\alpha$), diagonally opposing triangles are transition portions ($\beta$), and a portion above them is excellent quality portion ($\gamma$). Dislocation density of initial portion ($\alpha$) is g. Dislocation density of transition portions ($\beta$) is $g\cos^2\Theta$. Dislocation density of excellent quality portion ($\gamma$) is zero. Accordingly, when the crystal is cut between line $\theta$-$\theta$ and line $\eta$-$\eta$ an excellent quality is attained. It is not desirable to use the portions between line $\theta$-$\theta$ and line $\iota$-$\iota$ having high dislocation density.

The foregoing description refers to an ideal model. In practice, dislocation density does not become zero even in ($\gamma$). Next, average dislocation density in the lateral direction is calculated. As pitch is p and width of covering portion S is s, width e of exposing portion E is (p−s)(i.e., e=p−s). Based on that p>>s, (p−s) is substantially p. However, it is accurately expressed herein. Point M is the midpoint in exposing portion E, and u coordinate is (p−s)/2.

The coordinates of points O, K, and J (FIG. 11) are as follows:

O (0, 0)

K ((p<s)/2, (p−s) tan $\Theta$/2)

J (0, (p−s)(tan $\Theta$+tan 60°)/2)

As shown in FIG. 12, above exposing portion E, there are three portions $\alpha$, $\beta$, and $\gamma$ that are different in dislocation density. In the lateral direction (u-direction) also, there is such spatial distribution.

Specifically, when height w is in a range of OJ, i.e., 0 to (p−s)(tan $\Theta$+tan 60°)/2, dislocation density is decreased as w is increased. When w is not smaller than (p−s)(tan $\Theta$+tan 60°)/2, dislocation density is zero. That is, (p−s)(tan $\Theta$+tan 60°)/2 is height Qc that has a critical meaning.

Hence, setting the crystal thickness to be not smaller than (p−s)(tan $\Theta$+tan 60°)/2 and taking only the upper portion, dislocation density of 0 is achieved. That means the crystal must be thickly grown so that the crystal excluding the ridges and valleys is not smaller than (p−s)(tan $\Theta$+tan 60°)/2.

In the foregoing, it has been described about the case where growth is carried out while maintaining uniform facets ideally with the stripe mask. In practice, the growth deviates from such an ideal case. On the other hand, it is advantageous to know the ideal model of the stripe mask facet growth method, as it clarifies the characteristics of the present growth method. The critical height Qc is defined by the following expression.

$$Qc=(p-s)(\tan \Theta+\tan 60°)/2 \quad (1)$$

Dislocation density does not become 0 under critical height Qc of (p−s)(tan $\Theta$+tan 60°)/2. Dislocation density becomes zero in principle only when the crystal is grown not smaller than critical height Qc. Now, the presence of critical height Qc having such a significant meaning is made apparent.

In FIG. 11, the critical height is the height of point J (point $\epsilon$). FIG. 12 shows a plurality of facets F, wherein point $\epsilon$ is the critical height. Point $\delta$ is the plane height of ground substrate U, while point $\xi$ is the height of the bottom of the facet groove.

When manufacturing substrates by horizontally slicing the crystal shown in FIG. 12, the portion between point $\delta$ and point $\epsilon$ is not desirable, because it will provide wafers having high dislocation density. The portion between point $\epsilon$ and point $\xi$ is preferable, because it will provide wafers having low dislocation density. Therefore, the portion between line $\eta$-$\eta$ and line $\theta$-$\theta$ should be used.

Critical height Qc depends on slanting angle $\Theta$ of facet F, which is about 40° to 60°. Accordingly, (tan $\Theta$+tan 60°)/2 provides a value somewhat greater than 1.3.

In Patent Document 3 where pitch p is about 400 μm, critical height Qc is about 400 μm-500 μm and being about the required thickness of the substrate crystal. Therefore, the thickness of the crystal will always be not smaller than that value. Accordingly, critical height Qc is not substantially significant.

On the other hand, in the present invention, pitch p is far greater and p=2000 μm to 10000 μm is intended. Therefore, there is a substantive significance in critical height Qc=(p−s) (tan $\Theta$+tan 60°)/2 (the height of point $\epsilon$). For example, when (p−s)=4000 μm, critical height Qc will be 4000 μm to 6000 μm (4 mm to 6 mm). It means that, in order to obtain a crystal having low dislocation density, the crystal thickness (from the boundary between ground substrate U to the valley between the ridges) must be not smaller than 4mm to 6mm.

From the expression, it can be seen that slanting angle $\Theta$ of facet plane F is an important factor. This is precisely determined by the plane orientation of facet plane F.

(a) Critical Height Qc of Facet F of {11-2n} Type

Since this facet F is a plane intersecting at ½ of a-axis and 1/n of c-axis, it can be obtained by $\Theta=\tan^{-1}$ (2c/na). c=0.51850 nm, a=0.31892 nm, and therefore $\Theta=\tan^{-1}(3.251/n)$.

In particular, when n=1 ({11-21}), $\Theta$=72.902 degrees. Here, (tan $\Theta$+tan 60°)/2=2.492.

When n=2 ({11-22}), $\Theta$=58.405 degrees. Here, (tan $\Theta$+tan 60°)/2=1.679

When n=3 ({11-23}), $\Theta$=47.299 degrees. Here, (tan $\Theta$+tan 60°)/2=1.408

When n=4 ({11-24}), $\Theta$=39.102 degrees. Here, (tan $\Theta$+tan 60°)/2=1.272

For these facets F, critical height Qc has the following definite values.

$$\text{For \{11-21\} facet: } Qc=2.492 \,(p-s) \quad (2)$$

$$\text{For \{11-22\} facet: } Qc=1.679 \,(p-s) \quad (3)$$

$$\text{For \{11-23\} facet: } Qc=1.408 \,(p-s) \quad (4)$$

$$\text{For \{11-24\} facet: } Qc=1.272 \,(p-s) \quad (5)$$

(b) Critical Height Qc of Facet F of {1-10n} Type

Since this facet F is a plane intersecting at $3^{1/2}/2$ of a-axis and 1/n of c-axis, it can be obtained by $\Theta=\tan^{-1}$ (2c/$3^{1/2}$na). c=0.51850 nm, a=0.31892 nm, and therefore $\Theta=\tan^{-1}$ (1.877/n).

In particular, when n=1 ({1-101}), Θ=61.952 degrees. Here, (tan Θ+tan 60°)/2=1.804.

When n=2 ({1-102}), Θ=43.183 degrees. Here, (tan Θ+tan 60°)/2=1.335.

When n=3 ({1-103}), Θ=32.033 degrees. Here, (tan Θ+tan 60°)/2=1.179

That is, for these facets F, critical height Qc has the following definite values.

For {1-101} facet: $Qc=1.804\,(p-s)$ (6)

For {1-102} facet: $Qc=1.335\,(p-s)$ (7)

For {1-103} facet: $Qc=1.179\,(p-s)$ (8)

While it depends on the orientation of facet F, critical height Qc is about 1.2 to 2.5 times as great as pitch p. Since pitch p is great in the present invention, critical height Qc is so great that it is not negligible. For example, when pitch p=10000 μm, critical height Qc will be about 12000 μm-25000 μm (12 mm-25 mm). This is a great amount that is not negligible. It means that this amount of thickness from the boundary between the GaN crystal and ground substrate U is high in dislocation density. Since the portion up to critical height Qc is poor in quality, a crystal having a thickness (without ridge portions) not smaller than critical height Qc must be grown.

While various facets F can be produced, the most frequently produced facets F are {11-22} facet F and {1-101} facet F. Accordingly, Qc/(p-s) is about 2.2, approximately. It means that, when such facets F are produced, the crystal thickness without ridges and valleys must be at least 2.5 times as great as pitch p. {11-21} facet F is also highly frequently produced. When {11-21} facet F is produced, the crystal thickness without ridges and valleys must be at least 1.8 times as great as pitch p. Therefore, when the thickness of the crystal having its ridge portion ground and polished is t, t/(p-s) must be at least 2.5 in order to obtain a high quality crystal having low dislocation density.

According to the stripe mask method, the orientation of facet F formed in exposing portion E can be determined to some degree by the relationship between the extending direction of covering portion S and the crystal orientation of ground substrate U. Situations are different for each use of C-plane sapphire, C-plane SiC, and (111) GaAs. Here, a case where GaAs (111) Ga plane is used as ground substrate U is described.

On (111) Ga plane, there are perpendicular directions. They are <1-10> direction and <11-2> direction. A GaN crystal of <11-20> direction is grown in parallel to <1-10> of (111) GaAs plane. A GaN crystal of <1-100> direction is grown in parallel to <11-2> of (111) GaAs plane.

Accordingly, when the stripe mask is formed so that its extending direction is in parallel to <1-10> of (111) Ga plane, facet F produced in exposing portion E extends in parallel to <11-20> direction. Thus, facet plane F becomes {1-10n}. While the extending direction of facet F is univocally determined, fourth index n of the plane is not determined. It may be one of, or a combination of, {1-101}, {1-102}, {1-103}....

Alternatively, when the stripe mask is formed so that its extending direction is in parallel to <11-2> of (111) Ga plane, facet F produced in exposing portion E extends in parallel to <1-100> direction. Thus, facet plane F becomes {11-2n}. While the extending direction of facet F is univocally determined, fourth index n of the plane is not determined. It may be one of, or a combination of, {1-21}, {11-22}, {11-23}....

Since the crystal is facet-grown, it has high ridges and deep valleys. The ridge-valley portion is also not necessary. The ridge-valley portion must also be removed. As p is great, it also has a substantially great value. As it is equal to KM in FIG. 11, ridge-valley height Rv is obtained by $(p-s)\tan\Theta/2$. It also varies depending on the type of facet F.

(c) Ridge-Valley Height Rv of Facet F of {11-2n} Type

For {11-21} facet: $Rv=1.625\,(p-s)$ (9)

For {11-22} facet: $Rv=0.813\,(p-s)$ (10)

For {11-23} facet: $Rv=0.542\,(p-s)$ (11)

For {11-24} facet: $Rv=0.406\,(p-s)$ (12)

(d) Ridge-Valley Height Rv of Facet F of {1-10n} Type

For {1-101} facet: $Rv=0.938\,(p-s)$ (13)

For {1-102} facet: $Rv=0.469\,(p-s)$ (14)

For {1-103} facet: $Rv=0.313\,(p-s)$ (15)

While ridge-valley height Rv is different for each facet F, it is about 0.3 to 1.6 times as great as pitch p. For example, when pitch is 5000 μm, the ridge-valley height is also about 5000 μm, resulting in a crystal having greatly uneven surface.

The required height of crystal growth must be greater than the sum of the above-described Qc and Rv. Minimum required height Mc is the sum of them. Mc=Qc+Rv is:

$$Mc = Qc + Rv = (p-s)(\tan\Theta + \tan 60°)/2 + (p-s)\tan\Theta/2 \quad (16)$$

$$= (p-s)(2\tan\Theta + \tan 60°)/2 \quad (17)$$

This provides a substantially great value as pitch p is great. The value will be about 2 to 2.7 times as great as pitch p.

(e) Minimum Required Height Mc=Qc+Rv for {11-2n} Type

For {11-21} facet: $Mc=4.117\,(p-s)$ (18)

For {11-22} facet: $Mc=2.492\,(p-s)$ (19)

For {11-23} facet: $Mc=1.950\,(p-s)$ (20)

For {11-24} facet: $Mc=1.678\,(p-s)$ (21)

(f) Minimum Required Height Mc=Qc+Rv for {1-10n} Type

For {1-101} facet: $Mc=2.742\,(p-s)$ (22)

For {1-102} facet: $Mc=1.804\,(p-s)$ (23)

For {1-103} facet: $Mc=1.492\,(p-s)$ (24)

As above, minimum required height Mc is about 1.5 to 4.1 times as great as pitch p. While it may not pose a great problem in Patent Document 3 where pitch p is small, in the present invention where pitch p is great, it is important to take into consideration of minimum required height Mc.

Figure 13:
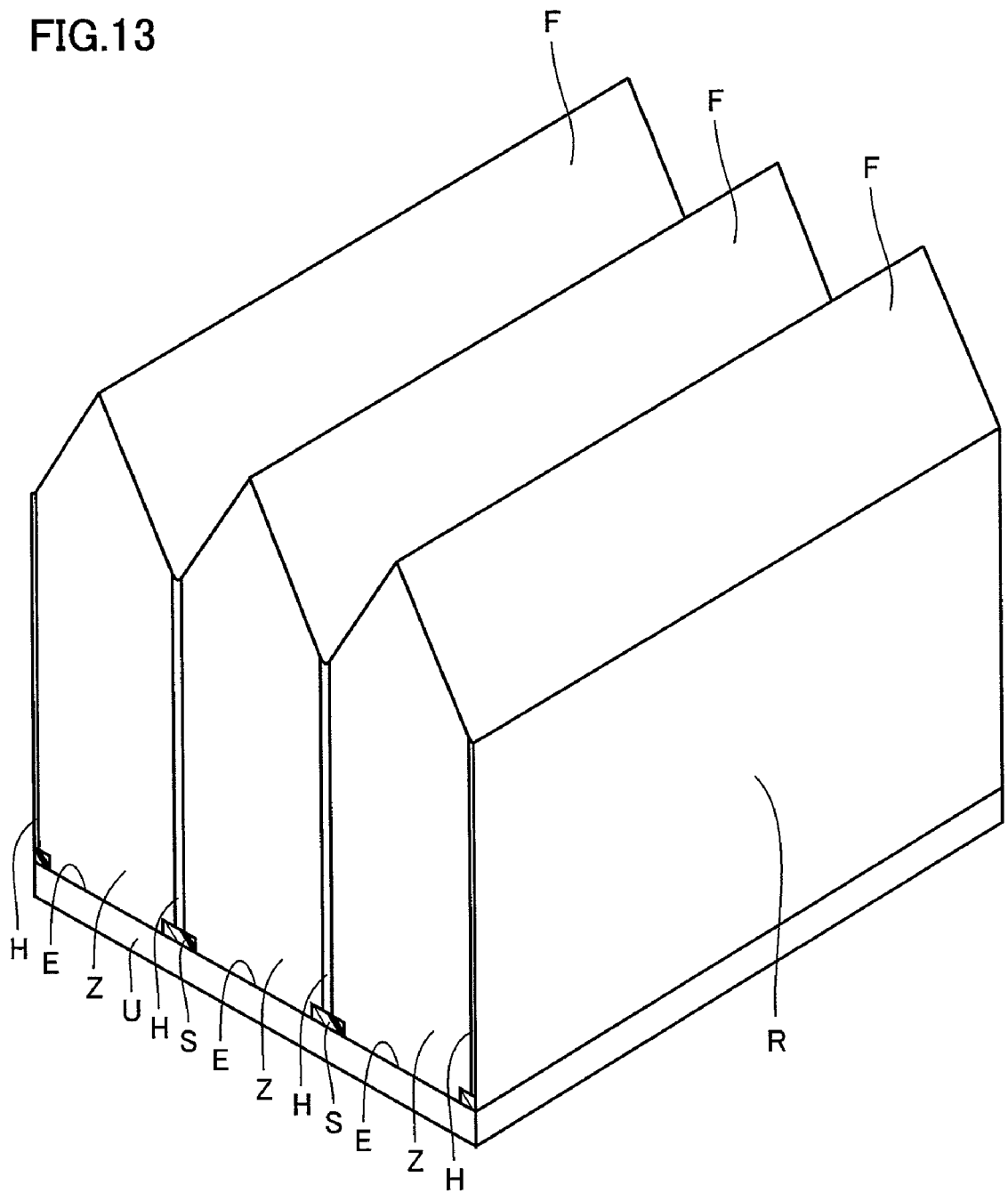
FIG. 13 is a perspective view of a GaN crystal R immediately after the growth. When GaN is facet-grown on ground substrate U having the stripe mask formed, low defect single crystal region Z of a ridge shape with reduced dislocations L is produced on exposing portion E, and low defect gathering region H with gathered dislocations L is produced on covering portion S. The whole crystal is structured by repetition of regions ZHZHZH . . . .

By HVPE, the growth of a thick GaN crystal as shown in FIG. 12 proceeds. How it spreads is not clear from FIG. 12, and therefore a perspective view is provided. FIG. 13 is the perspective view of a highly grown GaN crystal R. It is also a partial perspective view and not the entire view. As to the entire shape, the outer shape is the same as that of ground substrate U, and it may be circle or rectangle depending on the shape of ground substrate U. GaN crystal R has ground substrate U at its bottom, and its upper portion forms a ridge-valley structure formed by parallel facet planes F. The slanting angle of facet F depends on Miller indices. As calculated in the foregoing, it is a steep slanting of about 40° to 60°. The portion between facet F and exposing portion E becomes low defect single crystal region Z. The narrow portion between the facet bottom and covering portion S becomes defect gathering region H. A repetitive structure of HZHZHZ . . . with a ridge-shaped roof is obtained. This corresponds to the above-described structure shown in FIG. 4. In the case of FIG. 5 where the crystal is grown leaving C-plane growth region Y in the intermediate portion, a flat portion is present at the ridge (a perspective view not shown).

Figure 14:
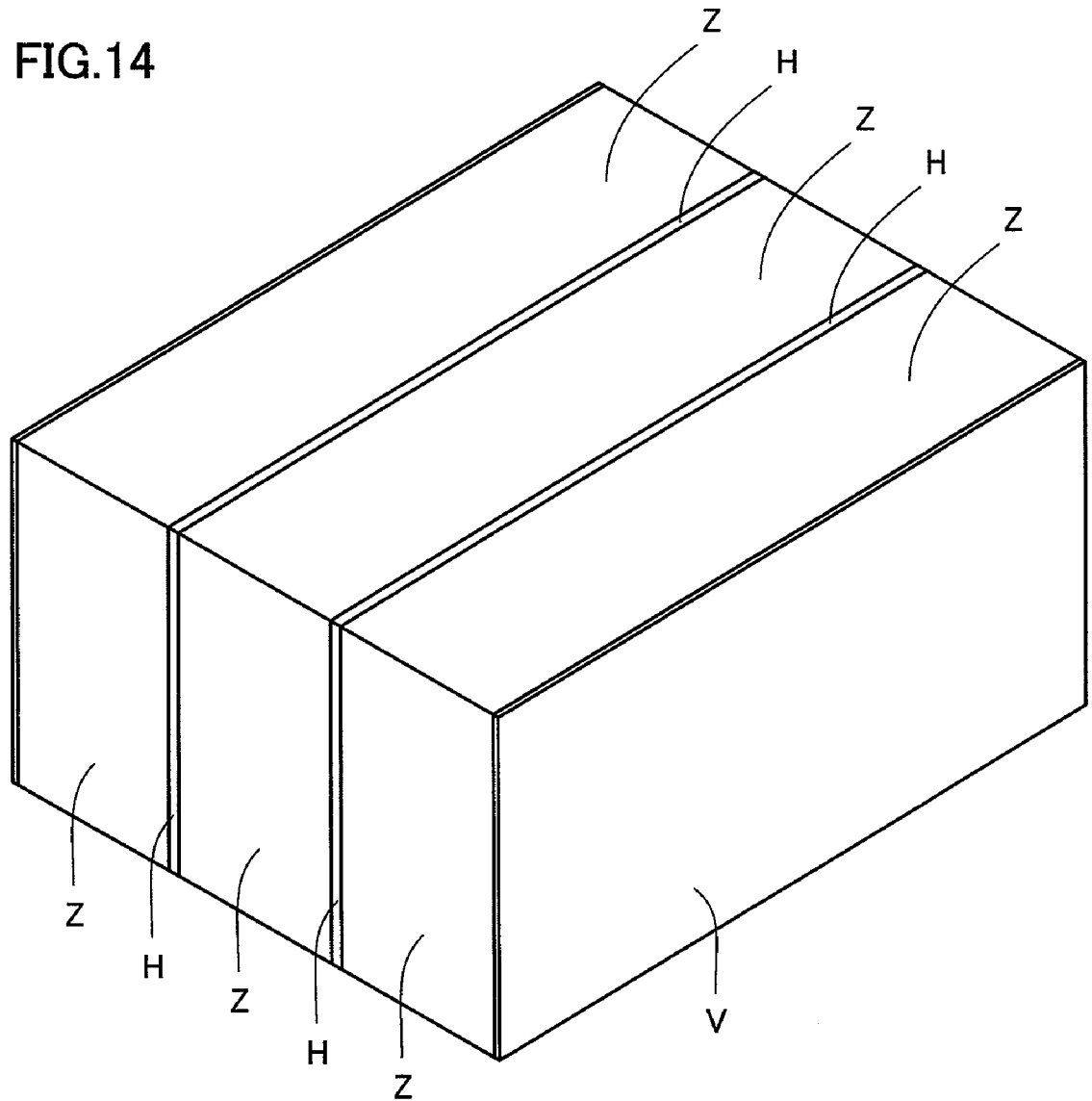
FIG. 14 is a perspective view of a portion of parallel and flat-plate-like thick crystal V having a structure ZHZHZH . . . in which low defect single crystal region Z with low dislocation density and defect gathering region H with gathered dislocation L are alternately and repetitively arranged. The structure is obtained by removing ridge-shaped portions from the crystal having repetition of ridges shown in FIG. 13 and removing ground substrate U.

From GaN crystal R, the upper ridge-roof portion is removed by grinding and polishing. Also, ground substrate U is removed by polishing or etching. Then, a thick, flat and smooth crystal V is obtained. It is shown in FIG. 14. The crystal have a ZHZHZH . . . structure where low defect single crystal regions Z and defect gathering regions H are repeated. Z and H are crystals of different orientation, wherein the top plane of Z is Ga-plane and that of H is N-plane. Again, the crystal is shown partially and not entirely. The entire shape is circle, rectangle or the like, according to the shape of the ground substrate.

Figure 15:
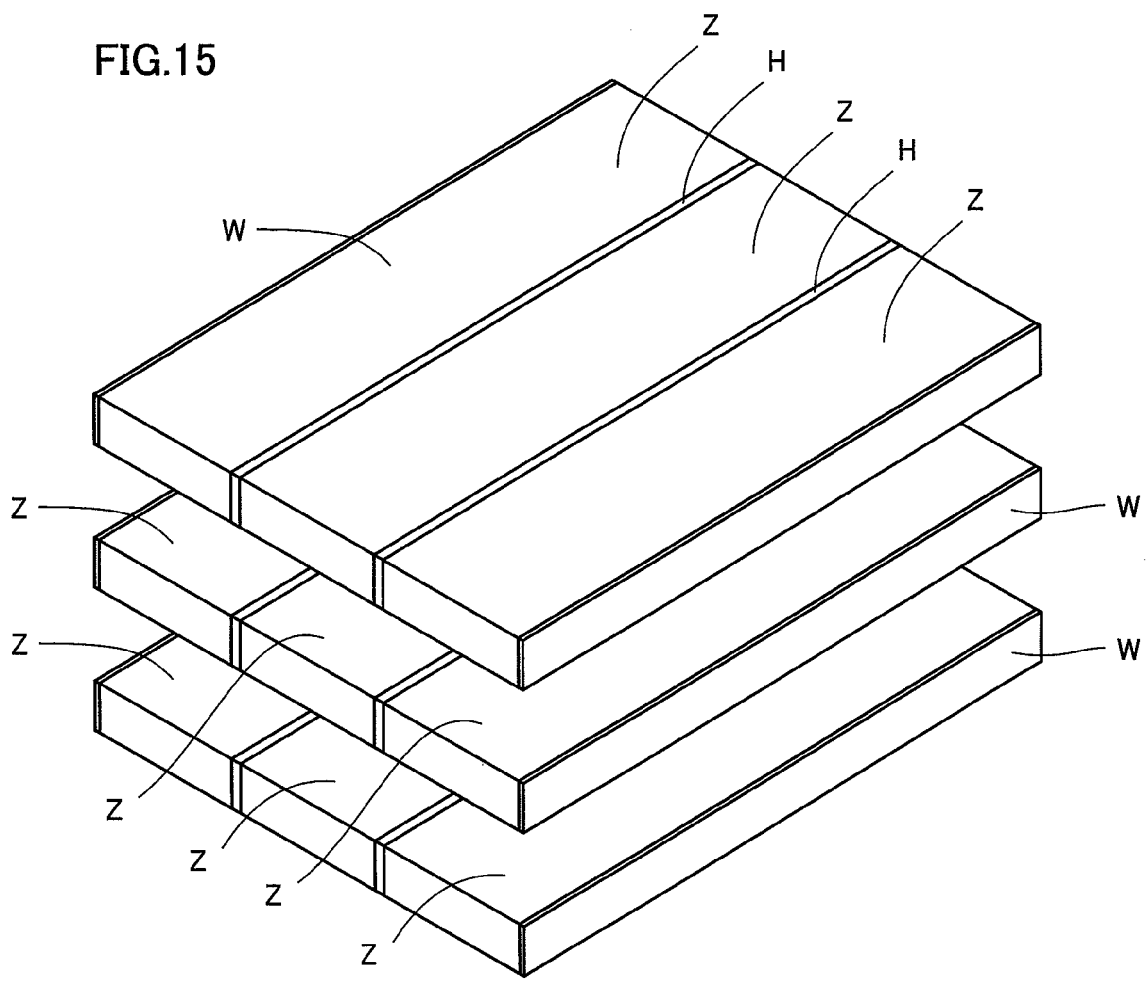
FIG. 15 is a perspective view showing a plurality of wafers obtained by horizontally cutting the flat-plate crystal having the repetitive structure of ZHZHZH . . . shown in FIG. 14.

Flat-plate like and smooth crystal V is horizontally cut into substrate crystals having an equal thickness. This is shown in FIG. 15. Thus, a plurality of as-cut wafers W having a constant thickness. Each wafer W has the ZHZHZH . . . structure where low defect single crystal regions Z and defect gathering regions H are alternately repeated.

Low defect single crystal regions Z and defect gathering regions H are single crystals, having the top plane of Ga-plane and N-plane, respectively. Observing the crystal by CL (cathode luminescence), fluorescence microscope or the like, Z and H are clearly distinguished and the presence of the ZHZH . . . structure is seen. Devices should be manufactured at low defect single crystal regions Z, while avoiding defect gathering regions H. As the width of each low defect single crystal region Z is 2000 μm to 10000 μm, the designing and manufacturing of the semiconductor devices is facilitated.

According to the present invention, a thick crystal is grown while maintaining facet F. It has a still further advantage. In order to provide conductivity of n type to a GaN substrate, an n-type dopant must be applied. As an n-type dopant for a thin-film GaN, Si is generally used. However, silane gas ($SiH_4$) has the risk of explosion, and it is not desirable to be used in a large amount.

As the n-type dopant, the present inventors employ oxygen (O) instead of Si. Oxygen can be supplied in a vapor phase such as water vapor or oxygen gas, and it is safe also. Oxygen is high in activation ratio, and most of the doped oxygen supplies electron carrier. There is such advantages. On the other hand, the oxygen doping is anisotropic and oxygen hardly enters GaN crystal R where C-plane growth occurs. However, oxygen actively enter inside of GaN crystal R where facet growth occur, via facet F. Accordingly, if a small amount of water vapor or oxygen gas is mixed with a material gas, the oxygen can naturally be doped into the growing GaN substrate. Since oxygen easily enters facet plane F, doping can be carried out at high concentration. The doping at oxygen concentration=$10^{16}$ cm$^{-3}$ to $10^{19}$ cm$^{-3}$ can be attained. This can render the resistivity of the GaN substrate to be not greater than 1Ωm. By slightly increasing the oxygen concentration in the material gas, the resistivity of the GaN substrate can be rendered to be not greater than 0.1Ωm. It is far safer than employing Si as the n-type dopant and to grow the substrate crystal. As compared with the C-plane growth, in the facet growth, oxygen is easily absorbed and the resistivity is small.

When width z of low defect single crystal region Z is greater, the low dislocation density region having a greater area can be obtained. The lower limit of width z is determined by the constraints on device fabrication, and the upper limit thereof is determined by the issue of irregularity of the growth plane or occurrence proportion of crystal defects. Patent Document 3 is suitable for a crystal where z=400 μm, approximately, and in the Patent Document 3, the upper limit of stripe mask pitch p is 2000 μm (20 μm≦p<2000 μm). This cannot provide a wide effective area.

The present invention raises the limits, so that pitch p is 2020 μm to 10400 μm, width z of low defect single crystal region Z is 2000 μm to 10000 μm (2mm to 10 mm), and width h of defect gathering region H is 20 μm to 400 μm. In consideration of costs, width z of low defect single crystal region Z is more preferably about 3000 μm to 5000 μm (3 mm to 5 mm). Great width z (pitch p) results in high facet ridge that is to be ground, and therefore the loss will be great.

The appropriate range of width h of crystal defect gathering region H employed herein is from 20 μm to 400 μm. Employing this range, defects can be gathered and a nitride-based substrate having wide low defect single crystal region Z can be manufactured. Since defect gathering region H cannot be used, it should advantageously be narrower. It may be narrow if it can effectively collect the surrounding dislocations L.

In consideration of control, width h of crystal defect gathering region H can be 1 μm, at the minimum. The upper limit thereof can be about 1000 μm. On the other hand, width h is better when narrower, and excessively wide width h results in many crystal defects. In consideration of costs, desirably h=20 μm to 400 μm. Since width h is preferably narrower, it should be in a range from 20 μm to 50 μm, if possible. Width h of defect gathering region H can be controlled to some degree by width s of covering portion S of the mask. However, since h is not equal to s, h cannot precisely be determined by s.

As described above, when doping is performed by mixing oxygen or water vapor with a material gas, oxygen can be doped via facet F and whereby a GaN crystal substrate of low resistivity can be fabricated. Setting the specific resistance of the present invention to be not greater than 1Ωm, the device characteristics of the GaN substrate can be improved significantly, and stability and yield can also be improved. More desirably, the specific resistance may be not greater than 0.1Ωm. As the crystal of the present invention grows while maintaining facet plane F where oxygen is easily absorbed, the substrate having the specific resistance of not greater than 0.1Ωm can be fabricated. Using such a substrate, it is possible to fabricate devices that have an n electrode at the bottom and a current passes through the substrate.

Using an $Al_xGa_yIn_{1-x-y}N$ (0≦x<1, 0<y≦1, x+y≦1) substrate, a substrate for wide application can be obtained.

By fabricating devices on a nitride-based group III-V compound semiconductor substrate fabricated by the above method, the device characteristics can be significantly improved.

According to the present method, the size of the mask formed on ground substrate U and the growth conditions are optimized, whereby the area of the low defect density region (Z or Z+Y) can be increased. By the optimization of the width of low defect single crystal region Z and that of crystal defect gathering region H, the area of low defect single crystal region Z can be increased. This makes it possible to optimize the width of low defect single crystal region Z and that of crystal defect gathering region H.

With the present invention, a stripe core substrate having low defect single crystal region Z of a wide area is fabricated. Accordingly, it is versatile.

The nitride substrate obtained by the present invention can widely be used as a substrate for devices such as: light-emitting elements such as light-emitting diodes and laser diodes; electronic elements such as rectifiers, bipolar transistors, field-effect transistors, HEMTs (High Electron Mobility Transistors); semiconductor sensors such as temperature sensors, pressure sensors, radiation sensors, and visible-ultraviolet light detectors; SAW (Surface Acoustic Wave) devices; vibrators; resonators; oscillators, MEMS (Micro Electro Mechanical System) components; and piezoelectric actuators.

EXAMPLE 1

In the following, a method of manufacturing a GaN substrate of the present invention will be described.

As ground substrate U, using a GaAs (111) substrate on which a stripe-shape mask ($SiO_2$) is directly formed, a GaN layer was grown by the HVPE method. In the Example, an ELO mask is formed on exposing portion E. The mask is made of wide, parallel and linear covering portions S and exposing portions E having the ELO mask provided with many small staggered windows. In the Example, exposing portions E are the partially exposing portions. Naturally, exposing portions E can be completely exposing portions. The present invention is applicable to both the complete exposure and partial exposure. GaCl gas obtained by allowing HCl gas to contact metal gallium at 800° C. was used as Ga source. $NH_3$ gas was used as N source, and $H_2$ gas was used as the carrier gas. Accordingly, the partial pressure of the difference between the total pressure and the combination of partial pressures of $NH_3$ gas and HCl gas is given by hydrogen gas. A GaN layer was grown in the following range of the epitaxial growth conditions by the HVPE method, at the growth temperature (the temperature of ground substrate U) of 1050° C.

| | |
|---|---|
| Total pressure: | 100 kPa ($1 \times 10^5$ Pa) |
| $NH_3$ partial pressure: | 7 to 30 kPa ($7 \times 10^3$ Pa to $3 \times 10^4$ Pa) |
| HCl partial pressure: | 2 to 9 kPa ($2 \times 10^3$ Pa to $9 \times 10^3$ Pa) |
| Growth period: | 10 to 200 hours |

The GaN crystals grown as above are used as samples A-J.

The obtained crystals were cut and the surface thereof was polished.

Thus, GaN substrates each having a thickness of 400 μm and a diameter of 2 inches (50 mm) were obtained.

The surface of each GaN substrate was etched by KOH—NaOH mixture melt of 350° C., and etch pits corresponding to dislocation L were formed. By measuring the density thereof, dislocation density was measured.

Table 1 shows $NH_3$ partial pressure, HCl partial pressure, film thickness, width z of low defect single crystal region Z, and average dislocation density in low defect single crystal region Z of the obtained sample.

TABLE 1

| Sample No. | $NH_3$ Partial pressure (kPa) | HCl Partial pressure (kPa) | Film thickness (μm) | Width of low defect single crystal region (μm) | Average dislocation density in low defect single crystal region ($cm^{-2}$) |
|---|---|---|---|---|---|
| A | 30 | 2 | 2000 | 400 | $3 \times 10^6$ |
| B | 30 | 2 | 2000 | 2000 | $1 \times 10^8$ |
| C | 30 | 2 | 5500 | 2000 | $2 \times 10^7$ |
| D | 20 | 3 | 5500 | 2000 | $4 \times 10^6$ |
| E | 15 | 4 | 5500 | 2000 | $2 \times 10^6$ |
| F | 15 | 4 | 5500 | 4000 | $7 \times 10^6$ |
| G | 15 | 4 | 9200 | 4000 | $3 \times 10^6$ |
| H | 10 | 6 | 16400 | 8000 | $5 \times 10^6$ |
| I | 7 | 9 | 16400 | 8000 | $2 \times 10^7$ |
| J | 10 | 6 | 21000 | 10000 | $5 \times 10^7$ |

The mask pattern of ground substrate U is as follows.

| | |
|---|---|
| pitch p: | p = 400 μm to 10000 μm |
| width s of covering portion S: | |
| for A-E | s = 50 μm |
| for F-J | s = 200 μm |
| width h of defect gathering region H: | |
| for A-J | h = 10 μm to 50 μm |

As above, width s of covering portion S and width h of defect gathering region H do not satisfy s=h, but are about the similar size. Generally, s>h. Since width s of covering portion S is determined by the mask formation, it is a controllable variable. However, width h of defect gathering region H is not controllable. As h is not determined, width z of low defect single crystal region Z is not predetermined precisely. However, since h is small, it can be regarded that width z of low defect single crystal region Z is substantially equal to pitch p.

What is related to the crystal quality is width z of low defect single crystal region Z. Accordingly, in the following, measurements of z for each sample are described. They are substantially equal to pitch p.

If y=0, then the expression p=e+s=z+h is always true. Here, e is substantially equal to z while h and s are small width of about the same size. Here, s, e and p are the predetermined values, while h and z vary along with the growth and therefore are not constants. The values of z and h are shown in the following expression, which are the values at the crystal surface (the plane formed at the ending stage of the growth).

h<s, and e<z. Accordingly, while p>z, z is an amount substantially equal to p, since h and s are small and z, p and e are great. When width s of covering portion S is small, p, z, e are substantially the same width.

[Sample A] z=400 μm, t=2000 μm, EPD (Etch Pit Density)=$3 \times 10^6$ $cm^{-2}$, $P_{NH3}$=30 kPa, $P_{HCl}$=2 kPa, s=50 μm, h=10 μm, p=410 μm, e=360 μm, y=0.

Sample A is a comparative example. The size of mask exposing portion E is about 400 Am, and width z of low defect single crystal region Z is about the same size. This is not what is intended by the present invention, but what is provided by the scheme of Patent Document 3. It was produced according to the HVPE method, under the condition of T=1050° C., $P_{NH3}$=30 kPa, and $P_{HCl}$=2 kPa. This condition was used in Patent Documents 2 and 3, and it is the most frequently used condition in the facet growth method. The grown GaN crystal has low dislocation density and the quality is excellent. However, the width z of low defect single crystal region Z is 400 µm, which is not z intended by the present invention, i.e., z of not smaller than 2000 µm.

[Sample B] z=2000 µm, t=2000 µm, EPD=1>$10^8$ cm$^{-2}$, $P_{NH3}$=30 kPa, $P_{HCl}$=2 kPa, s=50 µm, h=20 µm, p=2020 µm, e=1970 µm, y=0.

Sample B is also a comparative example. The size of mask exposing portion E is 2000 µm, being what is intended by the present invention. However, it is not appropriate because dislocation density amounts to $1×10^8$ cm$^{-2}$. This was also produced according to the HVPE method, under the condition of T=1050° C., $P_{NH3}$=30 kPa, and $P_{HCl}$=2 kPa. As described above, this condition is the condition used in Patent Document 3, and it is the most frequently used condition in the facet growth method. However, the dislocation density of the grown GaN crystal is $1×10^8$ cm$^{-2}$, and the quality thereof is low. It means that the condition of $P_{NH3}$=30 kPa and $P_{HCl}$=2 kPa used in Patent Document 3 for narrow p and z is not appropriate for wider z and p. In order to obtain z and p being greater than 2000 µm, the condition of the facet growth must be changed. The condition is different between the ordinary C-plane growth and the facet growth. The C-plane growth means that a crystal is grown while a flat C-plane is entirely maintained. That is, the crystal is grown slowly while thermal equilibrium condition is strictly maintained. The facet growth means that a crystal is grown fast and in a manner slightly out of equilibrium. Though it is not always true, there is a tendency that, in the facet growth, temperature is lower, HCl partial pressure is higher, and $NH_3$ partial pressure is higher as compared with the C-plane growth. However, with an excessively low temperature, an excessively high HCl partial pressure, and an excessively high $NH_3$ partial pressure, regular facets F cannot be maintained and irregular facets F are randomly produced at the growth plane. Accordingly, in order to realize ideal facet growth in which uniform facets are maintained, the condition for the crystal growth must be controlled to attain a narrow boundary-range condition, which is neither the C-plane growth nor the random growth.

Comparing samples A and B with each other, it can be seen that the boundary of the condition between the C-plane growth and the facet growth is not static. The condition of sample A, i.e., the condition of $P_{NH3}$=30 kPa and $P_{HCl}$=2 kPa, was the most frequently used optimum condition in Patent Document 3. This is not an excellent condition any more for sample B having greater p and z. In order to fabricate a substrate with pitch p greater than 2000 µm, a new optimum condition must be found that is suitable for it.

[Sample C] z=2000 µm, t=5500 µm, EPD=$2×10^7$ cm$^{-2}$, $P_{NH3}$=30 kPa, $P_{HCl}$=2 kPa, s=50 µm, h=20 µm, p=2020 µm, e=1970 >µm, y=0.

Sample C is also a comparative example. The size of mask exposing portion E is 2000 µm, being what is intended by the present invention. However, it is not appropriate because dislocation density amounts to $2×10^7$ cm$^{-2}$. This was also produced according to the HVPE method, and under the condition of T=1050° C., $P_{NH3}$=30 kPa, and $P_{HCl}$=2 kPa. As described above, this condition is the condition used in Patent Document 3. As compared with sample B of the same size and grown under the same condition, it shows reduced EPD. The difference between them is that the growth film thickness is 2000 µm in sample B, while it is 5500 µm in sample C. As used herein, a film thickness refers to the film thickness after the crystal is polished and becoming flat and smooth. Therefore, the height of ridges immediately after the crystal growth is far higher than that. A thicker film was grown and polished, and dislocation density of the surface was measured. In the facet growth method, along with growth, dislocations L gradually exit from low defect single crystal region Z and gather at defect gathering region H. Therefore, it is naturally understood that dislocation density in low defect single crystal region Z is lower in a thicker crystal. However, reduction in dislocation density is still insufficient when the crystal is grown for 5500 µm. This means that the condition of $P_{NH3}$=30 kPa and $P_{HCl}$=2 kPa, which is the common condition in the facet growth method, is not appropriate. Another condition is needed for greater z and p.

Then, $NH_3$ partial pressure and HCl partial pressure were varied to find better condition.

[Sample D] z=2000 µm, t=5500 µm, EPD=$4×10^6$ cm$^{-2}$, $P_{NH3}$=20 kPa, $P_{HCl}$=3 kPa, s=50 µm, h=20 µm, p=2020 µm, e=1970 µm, y=0.

Sample D is an Example. The size of mask exposing portion E is 2000 µm, being what is intended by the present invention. Dislocation density is not greater than $5×10^6$ cm$^{-2}$, and therefore it is appropriate. This was produced according to the HVPE method, and under the condition of T=1050° C., $P_{NH3}$=20 kPa, and $P_{HCl}$=3 kPa. As compared with the aforementioned condition of $P_{NH3}$=30 kPa and $P_{HCl}$=2 kPa, $NH_3$ partial pressure is lower by 10 kPa, and HCl partial pressure is higher by 1 kPa.

When masking pitch p is increased, the area of facet plane F is increased and the height/depth of ridge/valley is increased. Since the proportion of covering portion S is small, the growth speed tends to be fast. The growth speed must be slower, because facet F having the greater area must be maintained stably. To this end, it may be suitable to reduce $NH_3$ partial pressure. In the HVPE method, $NH_3$ and GaCl are caused to act at the second stage, and therefore the growth speed is often governed by $NH_3$ partial pressure. On the other hand, HCl partial pressure is increased by 1 kPa. It means that the concentration of GaCl being an intermediate is increased. If HCl partial pressure is maintained herein, the growth would not attain the facet growth but would become similar to the C-plane growth. Therefore, HCl partial pressure is increased.

Sample D has provided the guideline for supplying the material for the facet growth with wide masking pitch p. Specifically, when the masking pitch exceeds 2000 µm, the conventional $NH_3$ and HCl partial pressures of 30 kPa and 2 kPa, respectively, are not effective any longer, and $NH_3$ partial pressure should be lowered from 30 kPa while HCl partial pressure should be increased from 2 kPa. The uniform facet growth condition is intermediate between the random facet growth condition and the C-plane growth condition, for the growth while maintaining delicate balance. Since it varies by the size of pitch p, it is only empirically and experimentally obtained.

[Sample E] z=2000 µm, t=5500 µm, EPD=$2×10^6$ cm$^{-2}$, $P_{NH3}$=15 kPa, $P_{HCl}$=4 kPa, s=50 µm, h=30 µm, p=2030 µm, e=1980 µm, y=0.

Sample E is also an Example. The size of mask exposing portion E is 2000 µm and the thickness is t=5500 µm. Accordingly, the size thereof is the same as sample D. However, the growth condition is slightly different. By the growth condition of sample D, it was found that, for great pitch p or width z of low defect single crystal region Z, an increase in HCl partial pressure from 2 kPa and a reduction in $NH_3$ partial pressure from 30 kPa are suitable for the uniform facet growth. Accordingly, as compared to sample D, HCl partial pressure is further increased by 1 kPa, and $NH_3$ partial pressure is reduced by 5 kPa, so that $P_{HCl}$=4 kPa and $P_{NH3}$=15 kPa is attained. EPD is $2×10^6$ cm$^{-2}$, reduced by half as compared with Sample D and being further preferable. That is, it is found that, in order to realize the uniform facet growth with great p or z, $NH_3$ partial pressure should be reduced from 30 kPa and HCl partial pressure should be increased from 2 kPa. Now, how $NH_3$ partial pressure and HCl partial pressure should be changed depending on p and z should be considered.

[Sample F] z=4000 μm, t=5500 μm, EPD=7×10$^6$ cm$^{-2}$, $P_{NH3}$=15 kPa, $P_{HCl}$=4kPa, s=200 μm, h=50 μm, p=4050 μm, e=3850 μm, y=0.

Sample F is a comparative example. With sample E in which z=2000 μm, it was found that $NH_3$ partial pressure of 15 kPa and HCl partial pressure of 4 kPa are suitable. Under the same condition, the crystal in which z=4000 and pitch is about twice as great was produced. The ultimate thickness t was 5500 μm. Though the growth condition is the same as sample E, width z of low defect single crystal region Z is doubled and becoming 4000 μm. The ultimate thickness t (5500 μm) is also different. In the present invention, dislocations L are reduced by being pushed into a groove by growth of facet F. Accordingly, the growth thickness must be substantially great. In sample F, while width z (being substantially equal to pitch p) of low defect single crystal region Z in exposing portion E is wide, the crystal thickness is thin. Therefore, dislocations L are not sufficiently reduced. Here, t/z=1.375. t/(p−s) is substantially equal to t/z, and is about 1.428. This does not satisfy the condition t/(p−s)>1.8, i.e., the crystal growth must exceed Qc as described above. That is, the height of the crystal is not greater than Qc. That is, it is still middle of reducing dislocations. Therefore, while it shows 7×10$^*$cm$^{-2}$, it is assumed that the average dislocation density of the surface will further be reduced if the crystal is grown more thickly. The sample shows the higher dislocation density than sample E. The average dislocation density is higher than 5×10$^6$ cm$^{-2}$ that is the standard of the present invention, and therefore it is not a preferable crystal. For the great size of z=4000 μm, the thickness t=5500 μm is so thin that dislocations cannot be sufficiently reduced.

[Sample G] z=4000 μm, t=9200 μm, EPD=3×10$^6$ cm$^{-2}$, $P_{NH3}$=15 kPa, $P_{HCl}$=4 kPa, s=200 μm, h=40 μm, p=4040 μm, e=3840 μm, y=0.

Sample G is an example. It was found that, for sample E in which z=2000 μm and t=5500 μm, $NH_3$ and HCl partial pressure of 15 kPa and 4 kPa are appropriate, respectively. Sample F grown under the same condition in which z=4000 μm and t=5500 μm is not necessarily excellent. Sample G was also grown under the same condition and has the same z, but its thickness t is great. As its EPD is not greater than 5×10$^6$ cm$^{-2}$, the quality thereof is excellent. This is attributed to the great value of thickness t.

[Sample H] z=8000 μm, t=16400 μm, EPD=5×10$^6$ cm$^{-2}$, $P_{NH3}$=10 kPa, $P_{HCl}$=6 kPa, s=200 μm, h=40 μm, p=8040 μm, e=7840 μm, y=0.

Sample H is an Example. Sample C in which z=2000 μm and t=5500 μm is a crystal having high dislocation density of 2×10$^7$ cm$^{-2}$. While the size of sample D is the same size as sample C, it is obtained as a crystal having lower dislocation density by increasing HCl partial pressure and reducing $NH_3$ partial pressure. It seems that, when width e of exposing portion E, width z of low defect single crystal region Z and thickness t are increased, it is more preferable to increase HCl partial pressure and reduce $NH_3$ partial pressure.

Accordingly, with sample H in which z=8000 μm and t=16400 μm, $NH_3$ partial pressure is reduced to 10 kPa, and HCl partial pressure was increased to 6 kPa. The EPD on the surface of the crystal obtained under such a growth condition was 5×10$^6$cm$^{-2}$, which is satisfactory. Samples E and H provide the guideline as to how $NH_3$ partial pressure and HCl partial pressure should be adjusted depending on z and t. There should be some degree with which $NH_3$ partial pressure is reduced and HCl partial pressure is increased as z is increased. The suitable amount of change must also be considered.

[Sample I] z=8000 μm, t=16400 μm, EPD=2×10$^7$ cm$^{-2}$, $P_{NH3}$=7 kPa, $P_{HCl}$=9 kPa, s=200 μm, h=40 μm, p=8040 μm, e=7840 μm, y=0.

Sample I is a comparative example. A crystal having the same size as sample H in which z=8000 μm and t=16400 μm was grown under a different condition. $NH_3$ partial pressure was 7 kPa and HCl partial pressure was 9 kPa. In the foregoing conditions, $NH_3$ partial pressure was always higher than HCl partial pressure. However, it is reversed in Sample I. $NH_3$ partial pressure is slightly lower. It was an attempt based on the foregoing expectation that $NH_3$ partial pressure should be reduced and HCl partial pressure should be increased when z, p and t are greater. However, the average dislocation density was 2×10$^7$ cm$^{-2}$, being the crystal of high dislocation density. It means that $NH_3$ partial pressure was excessively reduced and HCl partial pressure was excessively increased.

Comparing samples H and I, the following is found. With a thick crystal in which difference in height between a ridge and a volley is great, such as a crystal in which z is 8000 μm and t is 16400 μm (16.4 mm), the appropriate degree may be 13 to 8 kPa for $NH_3$ partial pressure, and 4 to 8 kPa for HCl partial pressure.

[Sample J] z=10000 μm, t=21000 μm, EPD=5×10$^7$ cm$^{-2}$, $P_{NH3}$=10 kPa, $P_{HCl}$=6 kPa, s=200 μm, h=40 μm, p=10040 μm, e=9840 μm, y=0.

Sample J is a comparative example. A thick crystal having wide exposing portion E, in which z=10000 μm and t=21000 μm was produced. Though it was grown under the same condition as sample H, dislocation density of sample J was about ten times as great as that of sample H, and sample J is not an excellent crystal. Despite the same growth condition, great z and t prevented the uniform facet growth and facet plane F was irregular. Therefore, dislocations L were not sufficiently reduced.

It is assumed that the appropriate degree may be $P_{NH3}$=9 to 7 kPa and $P_{HCl}$=6 to 8 kPa for z=10000 μm (10 mm).

As above, as width z of low defect single crystal region Z is increased (p is widened), the appropriate range of $NH_3$ partial pressure and that of HCl partial pressure for the uniform facet growth are varied.

Figure 16:
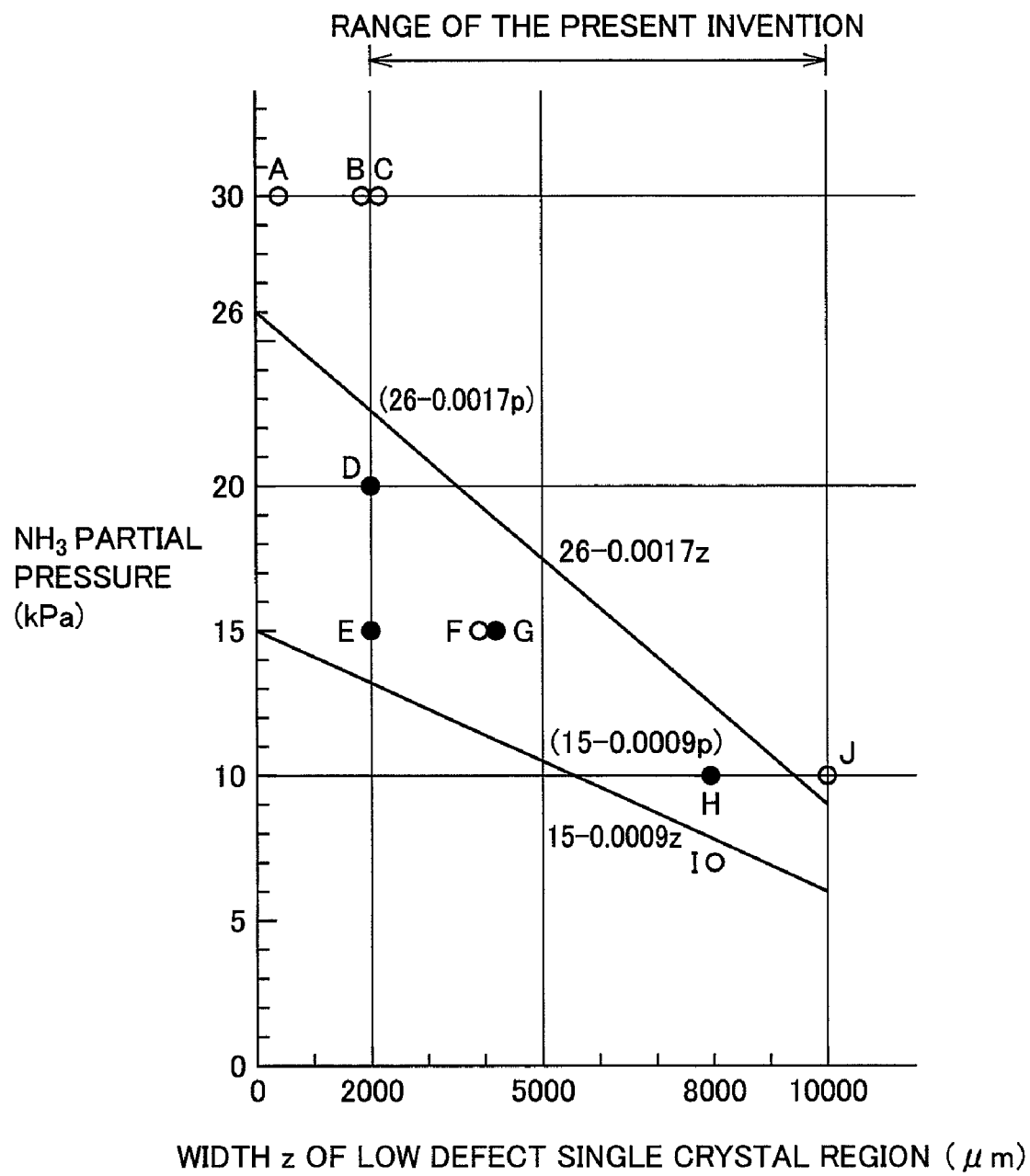
FIG. 16 is a graph in which the horizontal axis shows width z ($\mu$m) of low defect single crystal region Z and vertical axis shows NH3 partial pressure (kPa), and z and $P_{NH3}$ for each crystal sample A-J are shown by the coordinates. Crystal samples A-J are obtained as follows. GaN is grown on ground substrate U provided with covering portions S and exposing portions E, with various pitch p, according to the stripe HVPE method and while controlling $NH_3$ partial pressure and HCl partial pressure. Thus, crystals having repetitive structures of low defect single crystal regions Z and defect gathering regions H with various widths are produced. Ground substrate U is removed from each crystal and the ridge portions are ground and polished.
Figure 17:
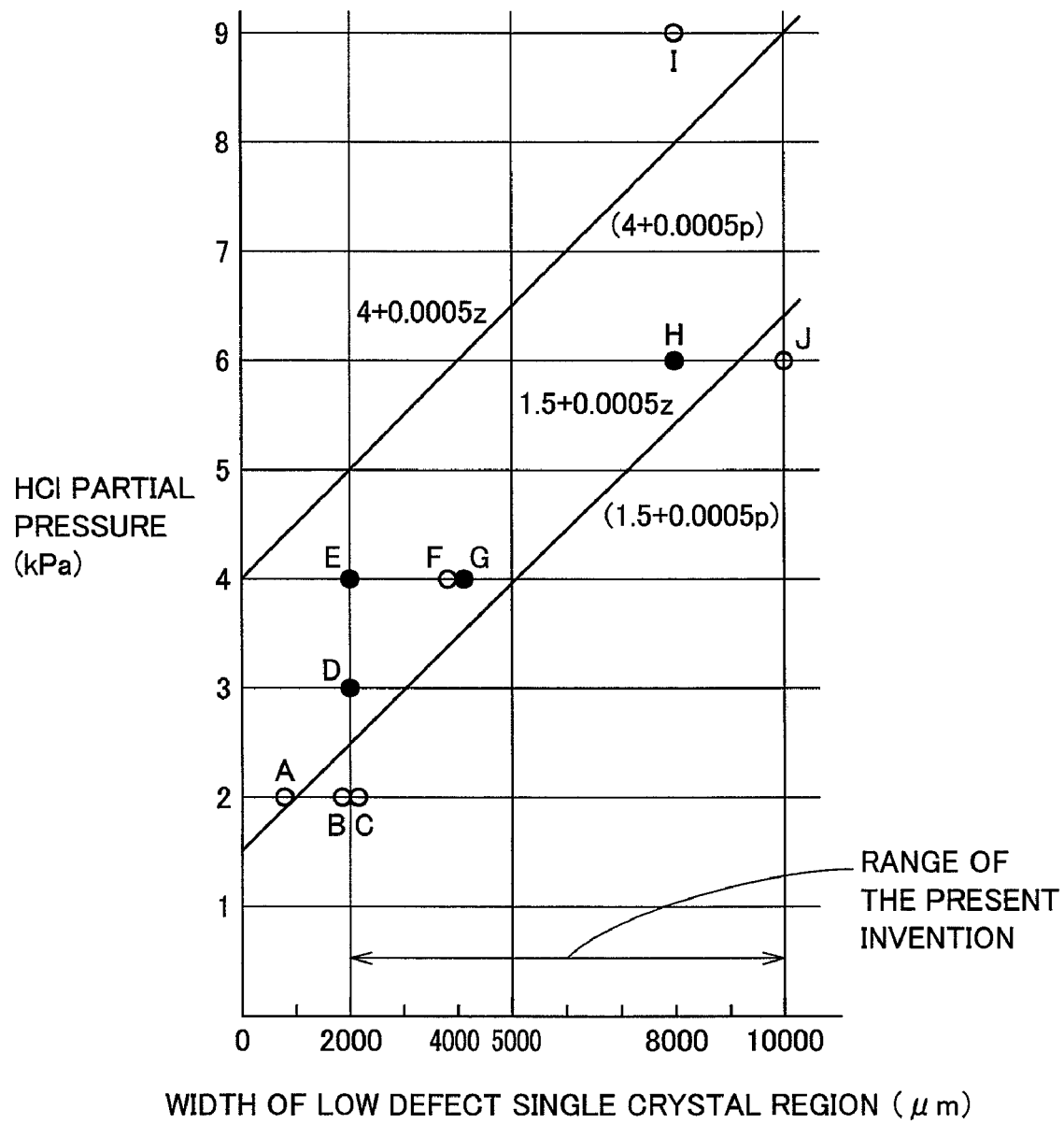
FIG. 17 is a graph in which the horizontal axis shows width z (am) of low defect single crystal region Z and vertical axis shows HCl partial pressure (kPa), and z and PHC for each crystal sample A-J are shown by the coordinates. Crystal samples A-J are obtained as follows. GaN is grown on ground substrate U provided with covering portions S and exposing portions E, with various pitch p, according to the stripe HVPE method and while controlling $NH_3$ partial pressure and HCl partial pressure. Thus, crystals having repetitive structures of low defect single crystal regions Z and defect gathering regions H with various widths are produced. Ground substrate U is removed from each crystal and the ridge portions are ground and polished.

Nine samples of A-J are compared with one another for $NH_3$ partial pressure and HCl partial pressure when prepared according to the HVPE method. FIG. 16 is a graph in which the horizontal axis indicates width z of low defect single crystal region Z and the vertical axis indicates $NH_3$ partial pressure (kPa). FIG. 17 is a graph in which the horizontal axis indicates width z of low defect single crystal region Z and the vertical axis indicates HCl partial pressure (kPa). The range according to the present invention is 2000 μm (2 mm) to 10000 μm (10 mm) for z. For the sake of clarity, points B and C are arranged side by side though they actually overlap with each other, and so are points F and G.

While partial pressure should be expressed by Pa, herein kPa (1000 Pa) is used as it is just the convenient unit. In FIGS. 16 and 17, values (z, $P_{NH3}$, $P_{HCl}$) of Samples A-J are shown. The examples (attaining low average dislocation density) is expressed by filled circles, and the comparative examples (attaining high average dislocation density) is expressed by open circles. In Patent Document 3, the typical condition was $NH_3$ partial pressure of 30 kPa and HCl partial pressure of 2 kPa. This appears as the condition of Samples B and C in which z=2000 μm. Samples B and C both show high average dislocation density and do not satisfy the requirements.

By a line by which filled circles are included and open circles are excluded, the preferable ranges of $NH_3$ partial pressure $P_{NH3}$ and HCl partial pressure $P_{HCl}$ can be found. Various lines are possible. Herein, a line that provides simple values is selected.

From FIGS. 16 and 17, it can be seen that preferable partial pressures of $NH_3$ and HCl vary by width z of low defect single crystal region Z. The preferable $NH_3$ partial pressure dependent on z is:

$$15-0.0009\,z \leq P_{NH3} \leq 26-0.0017\,z \quad (25)$$

The unit of partial pressure is kPa and the unit of z is μm. There are various possible lines, and it is not determined univocally. What is shown is an example, by which growth desired by the present inventors is realized. Hence, it is a guideline. As z is increased, the optimum range of $NH_3$ partial pressure is lowered. Comparative Examples A, B and C are located above line P=26−0.0017 z.

The condition frequently used in Patent Document 3 is the condition of A, B and C, i.e., $NH_3$=30 kPa and HCl=2 kPa. This is outside the range according to the present invention. It clarifies that the present invention is not the extension of Patent Document 3.

Comparative Example J is also located above line P=26−0.0017 z. Comparative Example I is located line P=15−0.0009 z.

Examples D, E, G, and H are located between two lines P=15−0.0009 z and P=26−0.0017 z. It means that the limitation by the two lines correctly represents the scheme of the present invention. Comparative Example F is also located between the two lines. This is because thickness t is small for pitch p. This will be discussed later.

The preferable HCl partial pressure dependent on width z of low defect single crystal region Z is:

$$1.5+0.0005\,z \leq P_{HCl} \leq 4+0.0005\,z \quad (26)$$

The unit of partial pressure is kPa and the unit of z is μm. Again, there are various possible lines. This is one example that can express the present invention. As z is increased, the optimum range of HCl partial pressure is raised. Comparative Examples B and C are located below line P=1.5+0.0005 z. The condition frequently used in Patent Document 3 is the condition of A, B and C, i.e., $NH_3$=30 kPa and HCl=2 kPa. A is outside the range of the present invention having the condition of z≧2000 μm. Again, it clarifies that the present invention is not the extension of Patent Document 3. Comparative Example J is also located below line P=1.5+0.0005 z. Comparative Example I is located above P=4+0.0005 z. Examples D, E, G, and H are located between two lines P=1.5+0.0005 z and P=4+0.0005 z. It means that the limitation by the two lines correctly represents the scheme of the present invention. Comparative Example F is also located between the two lines. This is because thickness t is small for pitch p. This will be discussed later.

Since width z of low defect single crystal region Z is a factor determining the quality of the substrate, the partial pressures are determined by z. However, z is not the variable that can directly be controlled. Rather, pitch p, width e of exposing portion E, and width s of covering portion S is the variables that can directly be controlled. These p, z, and e are substantially the same values, and when h is small, z is substantially equal to p. The difference is not greater than $\frac{1}{100}$. p is the masking pitch and it is the parameter initially known in designing the mask. Accordingly, inequalities in which z is substituted by p in the foregoing expressions are used as expressions determining the partial pressures.

The expressions of the optimum partial pressure ranges of $NH_3$ and HCl by pitch p are:

$$15-0.0009\,p \leq P_{NH3} \leq 26-0.0017\,p \quad (27)$$

$$1.5+0.0005\,p \leq P_{HCl} \leq 4+0.0005\,p \quad (28)$$

wherein the range of p is:

$$2020\ \mu m \leq p \leq 10400\ \mu m \quad (29)$$

Minimum value p=2020 μm is obtained by adding minimum h=20 μm to minimum z=2000 μm. Maximum value p=10400 μm is obtained by adding maximum h=400 μm to maximum z=10000 μm.

When p=2020 μm:

$$13.2\ kPa \leq P_{NH3} \leq 22.6\ kPa \quad (30)$$

$$2.5\ kPa \leq P_{HCl} \leq 5\ kPa \quad (31)$$

When p=10400 μm:

$$5.6\ kPa \leq P_{NH3} \leq 8.3\ kPa \quad (32)$$

$$6.7\ kPa \leq P_{HCl} < 9.2\ kPa \quad (33)$$

In Comparative Examples B and C, z=2000 μm, and $NH_3$ and HCl partial pressures were 30 kPa and 2 kPa, respectively, which were not smaller than 22.4 kPa and not greater than 2.5 kPa, respectively. Accordingly, excellent crystals were not produced.

In Comparative Example J, z=10000 μm, and $NH_3$ and HCl partial pressures were 10 kPa and 6 kPa, respectively, which were greater than 9 kPa and smaller than 6.5 kPa, respectively. Accordingly, excellent crystals were not produced. When z=10000 μm, $NH_3$ partial pressure should be 6 to 9 kPa, while HCl partial pressure should be 6.5 to 9 kPa.

Appropriate partial pressure ranges for other intermediate z (2000 μm to 10000 μm) and p (2020 μm to 1040 μm) can also be calculated by expressions (27) and (28).

Comparative Example F requires special consideration. In Comparative Example F, both the HCl partial pressure and $NH_3$ partial pressure are included in the above-described range. However, the average dislocation density is excessively high and thus not conforming. This is because crystal thickness t is too small. The ratio of thickness t to (p−s), i.e., subtracting width s of covering portion S from pitch p, is about 1.3, which does not satisfy the condition of being not smaller than 2.5.

Figure 18:
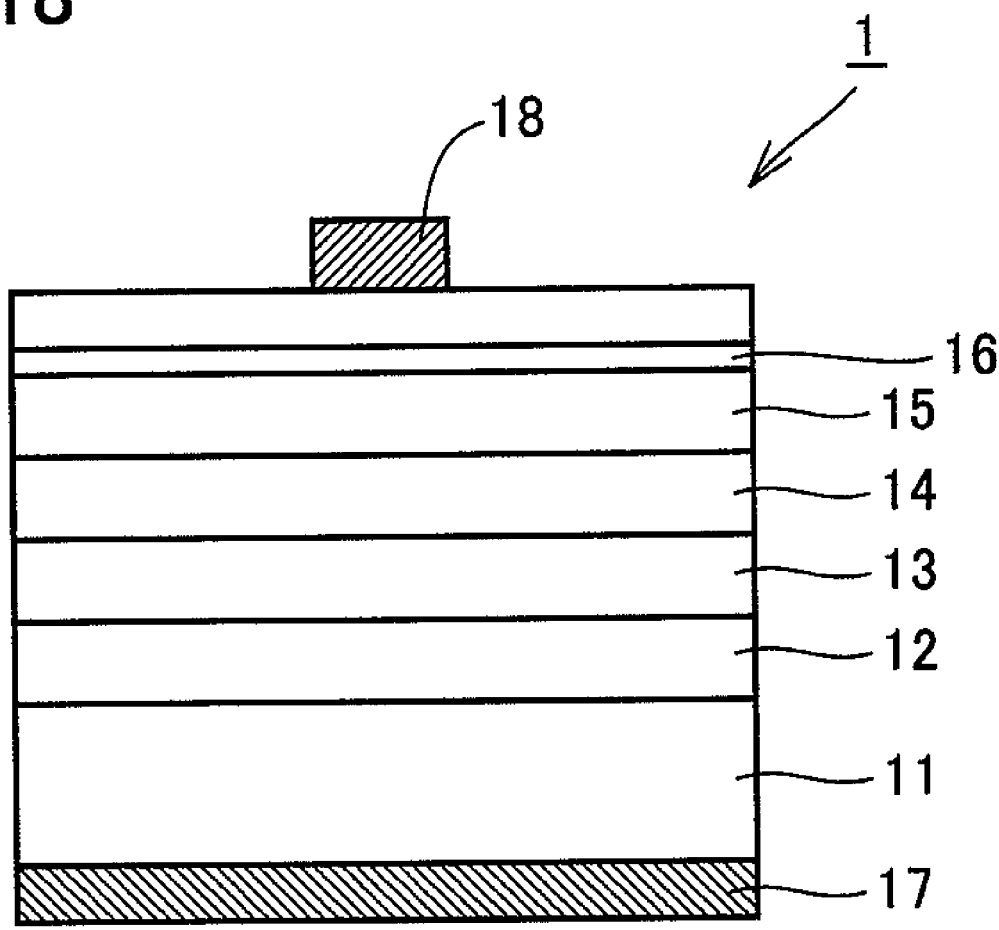
FIG. 18 is a schematic cross-sectional view showing a configuration of a light emitting diode that is a nitride-based semiconductor device in one embodiment of the present invention.

Next, referring to FIG. 18, a light emitting diode as a nitride-based semiconductor device according to one embodiment of the present invention is described. A light emitting diode 1 includes a GaN substrate 11 as a nitride substrate formed by GaN (gallium nitride), an n-type GaN layer 12 as a first n-type nitride layer formed on GaN substrate 11, an n-type $Al_{0.2}Ga_{0.9}N$ layer 13 as a second n-type nitride layer formed on n-type GaN layer 12, a light emitting layer 14 formed on $Al_{0.1}Ga_{0.9}N$ layer 13, a p-type $Al_{0.2}Ga_{0.8}N$ layer 15 as a first p-type nitride layer formed on light emitting layer 14, and a p-type GaN layer 16 as a second p-type nitride layer formed on p-type $Al_{0.2}Ga_{0.8}N$ layer 15. Light emitting diode 1 further includes an n-side electrode 17 as a first electrode formed on a main surface that is opposite to the side where light emitting layer 14 is formed, and a p-side electrode 18 as a second electrode formed on p-type GaN layer 16.

N-type GaN layer 12 and n-type $Al_{0.1}Ga_{0.9}N$ layer 13 contain an n-type impurity such as Si (silicon), and therefore they have n-type conductivity. On the other hand, p-type $Al_{0.2}Ga_{0.8}N$ layer 15 and p-type GaN layer 16 include a p-type impurity such as Mg (magnesium), and therefore they have p-type conductivity. Light emitting layer 14 may have a multiple quantum well structure in which a barrier layer formed by a GaN layer having a thickness of about 10 nm, for example, and a well layer formed by $Ga_{0.85}In_{0.15}N$ layer having a thickness of about 3 nm are alternately stacked. N-side electrode 17 and p-side electrode 18 are formed by conductors. GaN substrate 11 is a nitride substrate according to the above-described present invention. That is, light emitting diode 1 is a nitride-based semiconductor device including the nitride substrate according to the above-described present invention.

Next, an operation of light emitting diode 1 is described. Referring to FIG. 18, when negative potential is applied to n-side electrode 17, electrons are injected into light emitting layer 14 via GaN substrate 11, n-type GaN layer 12 and n-type $Al_{0.1}Ga_{0.9}N$ layer 13. On the other hand, when potential that is positive relative to n-side electrode 17 is applied to p-side electrode 18, positive holes are injected into light emitting layer 14 via p-type GaN layer 16 and p-type $Al_{0.2}Ga_{0.8}N$ layer 15. As a result, light associated with recombination of the electrons and the positive holes occurs in light emitting layer 14, whereby light emitting diode 1 emits light.

Light emitting diode 1 described above can be manufactured as follows, for example. First, according to the manufacturing method of the nitride substrate described above, a GaN substrate as a nitride substrate according to the present invention is fabricated. Thereafter, the main surface of the nitride substrate is polished by CW (Chemical Mechanical Polishing), for example. Thus, GaN substrate 11 described above can be obtained. Thereafter, on one main surface of GaN substrate 11, for example by the MOCVD (Metal Organic Chemical Vapor Deposition), n-type GaN layer 12, n-type $Al_{0.1}Ga_{0.9}N$ layer 13, light emitting layer 14, p-type $Al_{0.2}Ga_{0.8}N$ layer 15 and p-type GaN layer 16 are serially formed. N-side electrode 17 is formed on the other main surface opposite to the one main surface, and p-side electrode 18 is formed on p-type GaN layer 16 by deposition, for example. Thus, light emitting diode 1 in one embodiment of the present invention is completed. This light emitting diode 1 is manufactured using GaN substrate 11 having dislocation density suppressed that is the nitride substrate according to the present invention, and therefore dislocation density in n-type GaN layer 12, n-type $Al_{0.1}Ga_{0.9}N$ layer 13, light emitting layer 14, p-type $Al_{0.2}Ga_{0.8}N$ layer 15, and p-type GaN layer 16 is suppressed. As a result, light emitting diode 1 attains high luminous efficiency.

In the foregoing, while the description about the light emitting diode has been provided as one example of the nitride-based semiconductor device of the present invention, the nitride-based semiconductor device of the present invention is not limited thereto. The nitride-based semiconductor device of the present invention may be, for example, a laser diode, a rectifier, a bipolar transistor, a field-effect transistor, an HEMT, a temperature sensor, a pressure sensor, a radiation sensor, and a visible-ultraviolet light detector, a SAW device, a vibrator, a resonator; an oscillator, an MEMS component, a piezoelectric actuator or the like.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A manufacturing method of a nitride substrate, comprising the steps of:
   preparing a ground substrate having at least threefold rotational symmetry;
   forming, on said ground substrate, a mask having covering portions each having a width s=20 μm to 400 μm and exposing portions each having a width of 2000 μm to 10000 μm arranged in parallel to one another at regular intervals with a constant pitch p=2020 μm to 10300 μm; and
   placing said ground substrate having said mask formed thereon in a reactor having at least one of a Ga boat, an In boat and an Al boat, and heating said ground substrate to a temperature of 850° C. to 1100° C., wherein
   in said step of forming said mask, said exposing portions each interposed between said covering portions are completely exposing portions that completely expose, or partially exposing portions that partially expose and partially cover by provision of a plurality of windows,
   in said step of heating said ground substrate:
   HCl is supplied into said reactor so that partial pressure $P_{HCl}$ thereof satisfies $(1.5+0.0005\ p)\ kPa \leq P_{HCl} \leq (4+0.0005\ p)\ kPa$, to generate at least one of GaCl, InCl and $AlCl_3$;
   $NH_3$ is supplied into said reactor so that partial pressure $P_{NH3}$ thereof satisfies $(15-0.0009\ p)\ kPa \leq P_{NH3} \leq (26-0.0017\ p)\ kPa$, to allow $NH_3$ to react with at least one of said GaCl, InCl and $AlCl_3$, whereby an $Al_xGa_yIn_{1-x-y}N$ crystal ($0 \leq x<1$, $0<y \leq 1$) is grown on said ground substrate having said mask formed, whereby a ridge-valley structure including facet planes and a plurality of ridges and valleys parallel to one another is formed, said ridges and valleys having tops over intermediate portions of said exposing portions and bottoms over said covering portions, respectively; and
   said $Al_xGa_yIn_{1-x-y}N$ crystal is grown so that portions immediately above said covering portions become crystal defect gathering regions where dislocations are gathered and portions above said exposing portions and immediately below said facet planes become low defect single crystal regions where the dislocations are fewer than in said crystal defect gathering regions, and so that said ridge-valley structure is not buried while a height of said valleys from said ground substrate is allowed to exceed $2.5\ (p-s)$.

2. The manufacturing method of the nitride substrate according to claim 1, further comprising a step of
   removing said ridges by grinding or polishing, thereby producing a flat and smooth nitride substrate crystal of a uniform thickness having said ground substrate and a structure where said crystal defect gathering region and said low defect single crystal region being linear and parallel to each other are repeated with the pitch p.

3. The manufacturing method of the nitride substrate according to claim 2, further comprising a step of
   polishing or etching said flat and smooth nitride substrate crystal, thereby removing said ground substrate and said mask, and thereby producing a free-standing nitride substrate crystal formed by the structure where said crystal defect gathering region and said low defect single crystal region being linear and parallel to each other are repeated with the pitch p.

4. The manufacturing method of the nitride substrate according to claim 3, further comprising a step of
   cutting said free-standing nitride substrate crystal perpendicularly to a crystal growth direction, thereby producing a plurality of free-standing nitride substrate crystals having the structure where said crystal defect gathering region and said low defect single crystal region being linear and parallel to each other are repeated with the pitch p.

5. The manufacturing method of the nitride substrate according to claim 1, wherein, in said step of heating,
  said facet planes and a C-plane are formed above each of said exposing portions, and
  said $Al_xGa_yIn_{1-x-y}N$ crystal is grown so that portions immediately below said facet planes become said low defect single crystal regions and a portion immediately below said C-plane becomes a C-plane growth region.

6. The manufacturing method of the nitride substrate according to claim 5, further comprising a step of
  removing said ridges by grinding or polishing, thereby producing a flat and smooth nitride substrate crystal of a uniform thickness having said ground substrate and a structure where said crystal defect gathering region, said low defect single crystal region, said C-plane growth region and said low defect single crystal region being linear and parallel to one another are repeated with the pitch p.

7. The manufacturing method of the nitride substrate according to claim 6, further comprising a step of
  polishing or etching said flat and smooth nitride substrate crystal, thereby removing said ground substrate and said mask, and thereby producing a free-standing nitride substrate crystal formed by the structure where said crystal defect gathering region, said low defect single crystal region, said C-plane growth region and said low defect single crystal region being linear and parallel to one another are repeated with the pitch p.

8. The manufacturing method of the nitride substrate according to claim 7, further comprising a step of
  cutting said free-standing nitride substrate crystal perpendicularly to a crystal growth direction, thereby producing a plurality of free-standing nitride substrate crystals having the structure where said crystal defect gathering region, said low defect single crystal region, said C-plane growth region and said low defect single crystal region being linear and parallel to one another are repeated with the pitch p.

* * * * *